United States Patent [19]
Yoshida et al.

[11] Patent Number: 5,421,908
[45] Date of Patent: Jun. 6, 1995

[54] THIN-FILM SOLAR CELL AND METHOD FOR THE MANUFACTURE THEREOF

[75] Inventors: Takashi Yoshida; Sugao Saito; Takuro Ihara; Yukimi Ichikawa, all of Yokosuka, Japan

[73] Assignee: Fuji Electric Co., Ltd., Japan

[21] Appl. No.: 171,480

[22] Filed: Dec. 22, 1993

[30] Foreign Application Priority Data

| Dec. 28, 1992 | [JP] | Japan | 4-347394 |
| Mar. 26, 1993 | [JP] | Japan | 6-067976 |
| Apr. 6, 1993 | [JP] | Japan | 5-078382 |
| Sep. 6, 1993 | [JP] | Japan | 5-220870 |

[51] Int. Cl.⁶ .................. H01L 31/05; H01L 31/20
[52] U.S. Cl. .................. 136/244; 136/256; 136/258; 437/2; 437/4
[58] Field of Search ........... 136/244, 256, 258 AM; 437/2-5

[56] References Cited

U.S. PATENT DOCUMENTS

| 3,903,427 | 9/1975 | Pack | 250/208.2 |
| 3,903,428 | 9/1975 | DeJong | 136/244 |
| 4,532,371 | 7/1985 | Hanak et al. | 136/249 MS |
| 4,754,544 | 7/1988 | Hanak | 437/2 |
| 4,981,525 | 1/1991 | Kiyama et al. | 136/244 |

FOREIGN PATENT DOCUMENTS

| 55-133580 | 10/1980 | Japan | 136/258 PC |
| 59-88874 | 5/1984 | Japan | 136/256 |
| 60-18973 | 1/1985 | Japan | 136/249 MS |
| 60-95978 | 5/1985 | Japan | 136/249 MS |
| 60-117649 | 6/1985 | Japan | 136/249 MS |
| 63-119587 | 5/1988 | Japan | 136/244 |
| 1-281776 | 11/1989 | Japan | 136/244 |
| 3-101172 | 4/1991 | Japan | 136/244 |

*Primary Examiner*—Aaron Weisstuch
*Attorney, Agent, or Firm*—Parkhurst, Wendel & Rossi

[57] ABSTRACT

To reduce power loss in a transparent electrode with a high sheet resistance in a thin-film solar cell that uses an amorphous semiconductor layer, without having to use a complex patterning process. A large number of holes are formed through an insulating substrate, while a third electrode layer with a low sheet resistance is disposed on the rear side of the substrate and a transparent second electrode layer disposed on the light incidence side. The second and third electrode layers are connected to each other via said holes. To build a series-connection structure, an extended portion of the third electrode layer on one cell and extended portions of the first electrode layers on adjoining cells are connected to each other via similar holes formed on the substrate.

38 Claims, 20 Drawing Sheets 5,421,908

THIN-FILM SOLAR CELL AND METHOD FOR THE MANUFACTURE THEREOF

TECHNICAL FIELD

The present invention relates to a thin-film solar cell which uses a semiconductor thin-film as a photoelectric conversion layer comprising, for example, amorphous silicon as a main constituent and a method for the manufacture thereof.

BACKGROUND OF THE INVENTION

An amorphous semiconductor film made of amorphous silicon, for example, and formed by the glow discharge decomposition of material gases can be created easily in a large area because it grows in a gaseous phase, and can be used as a photoelectric conversion film for low-cost solar cells. Constructions that are well known to draw out electric power efficiently from such large-area amorphous solar cells may include those shown in FIGS. 4 and 5, which connect several solar cells in series. In FIG. 4, transparent electrodes 41, 42, 43 consisting of thin-films made of such transparent conductive materials as tin oxide, ITO and ZnO, are formed in strips on a translucent substrate 11 made of glass, transparent polymer films, or the like, over which amorphous semiconductor layer regions 31, 32, 33 are formed as photoelectric force generating parts, and thereafter metallic electrodes 21, 22, 23 made of metallic films such as Al and Ag are formed thereover. Combinations of the transparent electrode 41, the amorphous semiconductor layer 31, and the metallic electrode 21, and combinations of the transparent electrode 42, the amorphous semiconductor layer 32, and the metallic electrode 22 make up the individual cells. Patterns for both the electrodes and amorphous semiconductor layers are formed so that extended portions 51, 52, 53 of the metallic electrodes in one cell contact the edge of a transparent electrode on an adjoining cell, and these cells are then connected in series.

The solar cell shown in FIG. 4 generates power by light admitted through the substrate 11, while the solar cell shown in FIG. 5 generates power by light admitted from the side opposite the substrate. In the latter solar cells, metallic electrodes 21, 22, 23 made of Al and Ag are formed in strips on an insulating substrate 12 comprising a glass plate, polymer film, or metallic film which is covered with an insulating film, over which thin-film semiconductor layer regions 31, 32, 33 are formed, and then the transparent electrodes 41, 42, 43 made of tin oxide, ITO, or ZnO are formed in strips and several cells are connected in series in a manner similar to the above.

The series connection structure of these solar cells is most commonly formed by patterning each layer using a laser-scribing process, each time a layer is deposited on the substrate.

One of the purposes of this type of series connection structure in large-area solar cells is to obtain high output voltage from one such large-area solar cell. Another more basic purpose is to reduce the joule loss in transparent electrodes. To explain, if one cell of the solar cells is formed on the entire surface of a substrate without forming the series connection structure, generated carriers may migrate over a long distance in the transparent electrode and the metallic electrode on the rear side down to a lead take-out point disposed at the end of a solar cell. The metallic electrode generally has low resistance. As a result, joule loss caused by the current flowing through the metallic electrode may be neglected. However, sheet resistance in the transparent conductive thin-film may normally be as large as 5 to 30 Ω per square, hence joule loss caused by current flowing over a long distance in the transparent electrode layer cannot be disregarded. For this reason, conventional technology usually disperses a large-area solar cell into several strip-formed cells, and constructs these cells with a width from 4 mm to 20 mm.

However, it is also known to provide a system structured to have with a large number of solar cells, whereby it is not necessary to generate high output voltage from one large-area solar cell. In such cases, the series connection structure causes the following problems. One problem is that, if a large-area solar cell is so structured that it is split into several cells, linear dead spaces that do not contribute to power generation, that is, spaces 51, 52, 53 in FIGS. 4 and 5 are created between the cells. These dead spaces reduce the effective power generation area and therefore, the output from the solar cell. Another problem is that, since the requisite width of the cells has been determined as described above, the optimal number of cells increases as the substrate area increases, inevitably causing the output voltage to be high. If a solar cell with low-voltage output is formed without considering this optimal number of cells, there is a remarkably large loss in the maximum output.

Still another important problem is that the construction as described above generally requires patterning each time each metallic electrode layer, thin-film semiconductor layer, and transparent electrode layer is formed, which makes the manufacturing process complex. Moreover, unless ultra-fine patterning is carried out with sufficient positional accuracy, the ineffective area required for the series connection which does not contribute to power generation, increases, thereby reducing the efficiency. Furthermore, to pattern the thin-film semiconductor layer and the metallic electrode layer in the case of FIG. 4, and the thin-film semiconductor layer and the transparent electrode layer in the case of FIG. 5, it is necessary to cut the layers so that the layer beneath a particular layer is not damaged, which is difficult in the case of patterning that uses laser beams. However, adopting a wet process such as photoetching causes the manufacturing process to be complex, which makes it difficult to reduce manufacturing costs.

SUMMARY OF THE INVENTION

The present invention is intended to solve the conventional technical problems discussed above, and provides a solar cell with a new construction not requiring complex patterning even on a large-area substrate and having extremely small power loss due to power collection, and a method for the manufacture of such a solar cell.

In order to achieve the above objectives, the thin-film solar cell according to the present invention has a structure in which a first electrode layer is disposed on one face of an insulating substrate, and a transparent second electrode layer is disposed thereover so as to sandwich a semiconductor layer, which is a photoelectric conversion layer formed on the first electrode, a third electrode layer is disposed on the other face of the substrate, and the third electrode layer is connected to the second electrode layer by a conductor that is substantially insulated from the first electrode layer through a connecting hole that extends through the substrate, the first electrode layer, and the semiconductor layer. Furthermore, the connecting holes may be disposed discretely at equal spaces. It is effective for a region in the third electrode layer separated from a region connected to the second electrode layer to be connected to the first electrode layer by a conductor substantially insulated from the regions in the opposing second electrode layers sandwiching the first electrode layer and the semiconductor layer through a connecting hole that at least through the substrate. In that case, an extended portion of the conductor connecting the first electrode layer with the third electrode layer may be placed in contact with the second electrode layer, and the regions in the second electrode layers may be separated by a linearly removed portion from regions in the opposing second electrode layers sandwiching said first electrode layer and semiconductor layer.

Another thin-film solar cell according to the present invention has a structure in which several solar cells are formed using the substrate commonly, in which a first electrode layer is disposed on one side of an insulating substrate, and a transparent second electrode layer is disposed on the opposite side so as to sandwich a semiconductor layer which is a photoelectric conversion layer formed on the first electrode, a third electrode layer is disposed on the other face of the substrate, and the third electrode layer is connected to the second electrode layer by a conductor substantially insulated from the first electrode layer through a connecting hole that extends through the substrate, the first electrode layer, and the semiconductor, and the solar cells are connected in series by means of an extended portion of the first electrode layer in one solar cell which is connected to extended portions of the third electrode layers in adjoining solar cells through a connecting hole that extends through the substrate by a conductor substantially insulated from the second electrode layer in the solar cell. It is effective for the solar cells to be arranged adjoining with each other in one direction, and the extended portions of the third electrode layer in the solar cells and the third electrode layer in the adjoining solar cells adjoin said arrangement perpendicularly or adjoin in one direction. It is advisable in the latter case for the width of the third electrode layer including the extended portion in the arrangement direction of the solar cells to be substantially the same as the width of a laminated body comprising the first electrode layer on the opposite side to the substrate, the semiconductor layer and the second electrode layer. It is also effective for the solar cells to be arranged in several banks, the solar cells in two banks to be connected in series by the third electrode layer which is arranged in common to the terminals on both banks to the first electrode layer in the end solar cell in one of the banks and the second electrode layer in the end solar cell in the other bank through the connecting holes that extends through the respective substrates. The terminals to remove the output may be disposed on the third electrode layer on the side opposite the substrate.

It is effective for the semiconductor layer to be made of amorphous semiconductor thin-film, and for the first or the third electrode layer to be made of a metallic thin-film. The conductors connecting the second electrode layers or the first electrode layers may be the portions of the second electrode layer, the third electrode layer, or the first electrode layer extending into the connecting hole. For that purpose, the third electrode layer may be made of a printed conductor. In addition, the conductor connecting the second electrode layers may be the extended portion of a current-collector electrode layer on the second electrode layer formed by printing extending into the connecting hole. It is also effective for the conductors connecting the first electrode layers to comprise a conductor extending through the substrate, the first electrode layer, the semiconductor layer and the second electrode layer, a conductor on the second electrode layer, and a conductor extending through the electrode layer and the semiconductor layer. It is also effective for the conductors connecting the electrode layers to be low-melting point alloys filled in the connecting holes, and for the substantial insulation between the conductor connecting the second electrode layer and the first electrode layer to be carried out by the extended portion of a semiconductor layer with a high-resistance factor interposed between the conductor and the electrode layer.

In a method for manufacturing the thin-film solar cell as described above, the first electrode layer is deposited on one face of the insulating substrate formed with a connecting hole, then the first electrode layer on the inner wall of the small hole and in the peripheral annular part is removed by irradiating a laser beam. Thereafter, the semiconductor layer and the second electrode layer are laminated sequentially from one side of the substrate, and further, the third electrode layer is formed from the other side, or a connecting hole is formed after the first electrode layer is deposited on one face of the insulating substrate. Then the semiconductor layer and the second electrode layer are laminated sequentially from one side of the substrate, and further, the third electrode layer is formed from the other side. It is acceptable for the latter case that the conductor connecting the first electrode layer is formed on part of the connecting hole before the semiconductor layer and the second electrode layer are formed. Both electrodes to be connected may be brazed through the connecting hole. It is effective for the electrode layers to be separated by the linearly removed portion using laser processing and the linearly removed portions in two electrode layers that sandwich the substrate are formed simultaneously.

Since the conductor extending through the first electrode layer and the semiconductor layer laminated on one face of the insulating substrate connects the transparent second electrode layer thereon to the third electrode layer on the other face of the substrate, carriers which are generated by a light incident the semiconductor layer through the transparent electrode layer can be taken out from the first and third electrode layers. When each layer is formed on the insulating substrate that has been formed with a small hole, thin-films of each layer are also formed on the inner wall of the small hole. If the first electrode layer part of those which is formed in the first place, including the periphery of the small hole, is removed by irradiating a laser beam, the extended portions of the second electrode layer and the third electrode layer superimposed thereon are insulated from the first electrode layer, and the extended portions of the second electrode layer and the third electrode layer contact each other, and are connected. The electric current must then flow through a transparent conductive material film with a high-sheet resistance up to the connecting hole. As a result of the long path up to the terminals or the adjoining cells, current flows through the third electrode layer with a lower sheet resistance. In this way, electric power loss is reduced. Otherwise, if the first electrode layer is formed before the small hole is formed, since the first electrode layer is not present on the inner wall of the small hole formed thereafter, the need to irradiate a laser beam is eliminated. Moreover, if each solar cell is structured as described above, and the extended portion of the first electrode layer in one solar cell is connected to the third electrode layer on the other face by a conductor extending through the insulating substrate, and its third electrode layer is connected with a third electrode layer in an adjoining solar cell, several solar cells formed on both sides of the large-area substrate can be connected easily in series. In that case, if the third electrode layer is shifted from a solar cell on the opposite side of the substrate, and one half width is connected to the first electrode in one solar cell, and the other half width is connected to the second electrode layer in the adjoining solar cell, a series connection structure can be formed by linearly removing each electrode layer using a laser beam.

Connection through the connecting hole extending through the substrate can also be performed by a low-melting point alloy or a printed conductor other than by the extended portion of the electrode layers deposited on the connecting hole, and the process involved is simple. Furthermore, because the terminals can be disposed on the side opposite the light incidence face, area efficiency is improved.

DETAILED DESCRIPTION OF THE PREFERRED EMBODIMENTS

The embodiments of the present invention are explained hereunder with reference to the appended drawings.

Figure 1A:
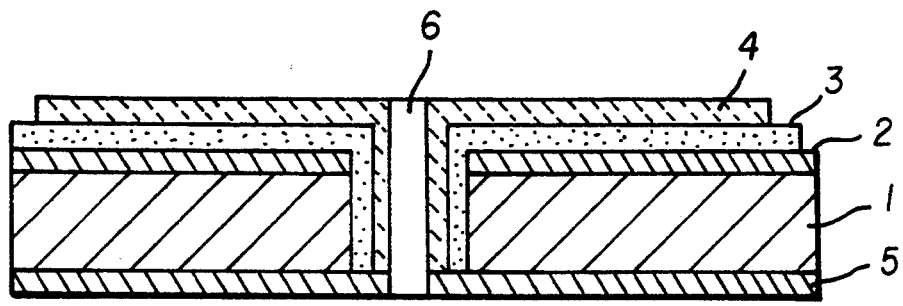
FIGS. 1(a) and (b) show a thin-film solar cell, according to one embodiment of the present invention, in cross-section and plan view.

In the embodiments shown in FIGS. 1(a) and (b), a first electrode layer 2 made of silver with a thickness of 1400 Å, an amorphous semiconductor layer 3 having a PIN junction, and a transparent second electrode layer 4 made of ITO with a thickness of 2000 Å are laminated on an insulating substrate 1, while a third electrode layer 5 made of titanium with a thickness of 5000 Å is formed on the rear side of the insulating substrate 1. The third electrode layer 5 and second electrode layer 4 are electrically connected to each other because the third electrode layer 5 and amorphous semiconductor layer 3 extend through a connecting hole 6. The semiconductor layer 3 has a high resistance and is therefore insulated from the first electrode layer 2 as a result.

Figure 2:
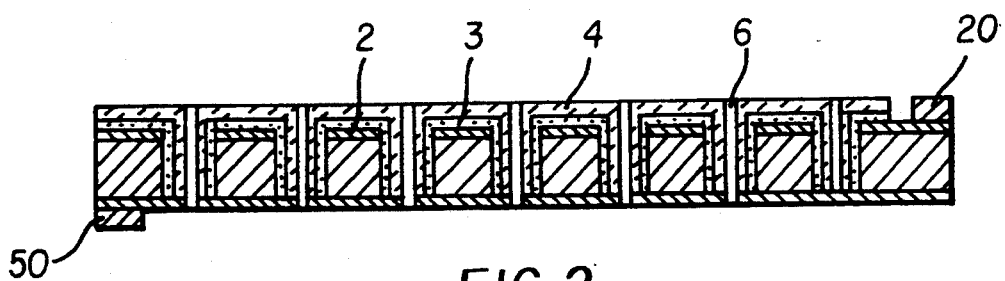
FIG. 2 is a cross-sectional drawing showing a thin-film solar cell according to another embodiment of the present invention.

The above construction is fabricated in the following way. First, silver is formed by a sputtering process to a thickness of 1400 Å as the first electrode layer on the insulating substrate 1. Then, the hole 6 is formed using a metal punch. The diameter of this hole should preferably be 1 mm or smaller so that the effective area of the solar cell will not be reduced. The methods used to form the hole with such a small diameter include drilling with a metal drill, a heated needle, and a laser. The amorphous semiconductor layer 3 was formed on the substrate using a CVD process, and an ITO film made of a transparent conductive material was formed thereupon using a sputtering process to a thickness of 2000 Å as the second electrode layer 4. Finally, titanium (Ti) was formed using a sputtering process to a thickness of 5000 Å on the opposite side of the substrate as the third electrode layer 5. At this time, the third electrode layer 5 will contact not only the lower edge of the amorphous semiconductor layer 3 deposited in the connecting hole 6 and the second electrode layer 4, but will also extend through the connecting hole 6 and contact the second electrode layer 4, causing the third electrode layer 5 and the second electrode layer 4 to be well connected electrically. The third electrode layer 5 may be made of a highly corrosion-resistant stainless steel or aluminum instead of titanium. Because this construction allows a current that is generated peripherally to the connecting hole 6 to flow through the third electrode layer 5 with a low resistance as a base material even if the sheet resistance is high in the transparent conductive material of the second electrode layer 4, a large-area solar cell can be fabricated without patterning by optimizing the interval for the connecting hole 6 in accordance with the sheet resistance of the transparent electrode. As a result, the electromotive force can be drawn out from an exposed portion formed at the edge of the first electrode layer 2 on the surface of the insulating substrate 1 and the third electrode layer 5 on the rear side of the substrate. FIG. 2 shows a solar cell constructed in this way, in which a large number of connecting holes 6 with a diameter of 1 mm are formed, connecting holes 6 being spaced apart 20 mm as the smallest interval, and a (+) terminal 20 and a (−) terminal 50 are disposed at the edge of the first electrode layer 2 and the edge of the third electrode layer 5.

Figure 3:
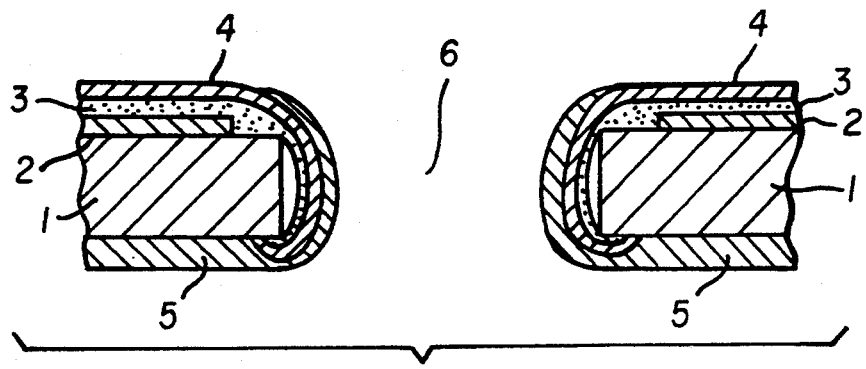
FIG. 3 is an expanded cross-sectional drawing showing a connecting hole in the thin-film solar cell shown in FIG. 2.
Figure 4:
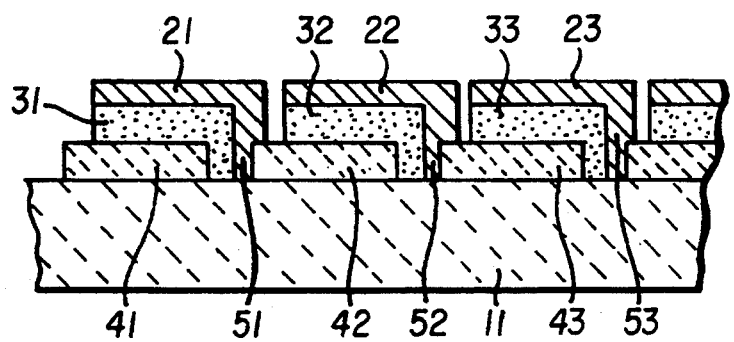
FIG. 4 is a cross-sectional drawing showing a conventional thin-film solar cell with a series-connection structure.
Figure 5:
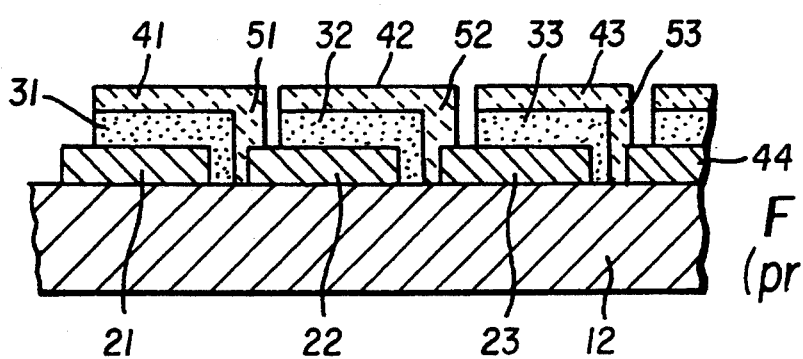
FIG. 5 is a cross-sectional drawing showing another conventional thin-film solar cell with a series-connection structure.

FIG. 3 shows a cross section of the connecting hole 6 of another embodiment, with the vicinity thereof magnified. The connecting holes 6 are formed through the insulating substrate 1 by means of a $CO_2$ laser or punching device. The insulating substrate may be formed of a polymer film. Next, a thin aluminum film is formed by a sputtering process to thicknesses of 300 mm as the first electrode layer 2 on one of the faces of the insulating substrate 1 having connecting holes, and then a laser beam with a spot diameter of 0.9 mm is irradiated into the connecting holes 6 from above this thin aluminum film to remove the aluminum film deposited on the inner walls of the connecting holes 6 and around the periphery thereof. Further, a thin-film semiconductor layer 3 made of an amorphous semiconductor is formed using a CVD process, and a transparent second electrode layer 4 made of a ZnO film is formed using a sputtering process on the first electrode layer 2 to thicknesses of 500 nm and 1 μm, respectively. This amorphous semiconductor layer 3 and transparent electrode layer 4 deposit on the inner wall of the connecting holes of the insulating substrate 1 and around the connecting holes on the other side of the substrate as shown in FIG. 4. Finally, a thin aluminum film is formed to a thickness of 300 nm on the other face of the polymer film using a sputtering process to form the third electrode layer 5. The third electrode layer 5 is also deposited on the inner wall of the connecting holes 6 and around the connecting holes on the other side of the substrate, that is, the transparent electrode side. Thus, the second electrode layer 4 and the third electrode layer 5 contact each other on the inner walls and on the periphery of the connecting holes 6, thereby creating electrical continuity. On the other hand, part of the first electrode layer 2 around the connecting hole 6 is removed by the laser beam irradiation, and the second electrode layer 4 and the third electrode layer 5 on the inner walls and on the periphery of the connection hole are insulated by the amorphous semiconductor layer 3 having a high resistance factor. In this embodiment, the dead space area on the substrate that does not contribute to power generation is the area of the connecting hole 6 and part of the first electrode layer 2, which has been removed by laser beam irradiation, wherein the effective power generating area was increased by 5% or more than in a conventional series connection structure, while the power generated was increased by as much as the area increase.

Figure 6A:
FIGS. 6(a) to (g) are cross-sectional drawings showing the manufacturing processes of thin-film solar cells according to another embodiment of the present invention.
Figure 6B:
Figure 6C:
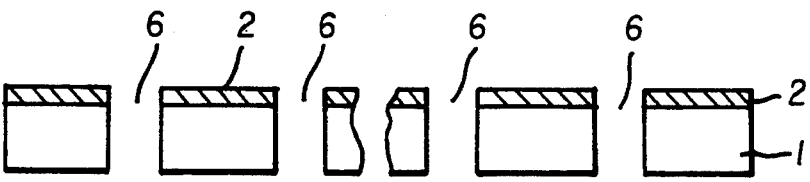
Figure 6D:
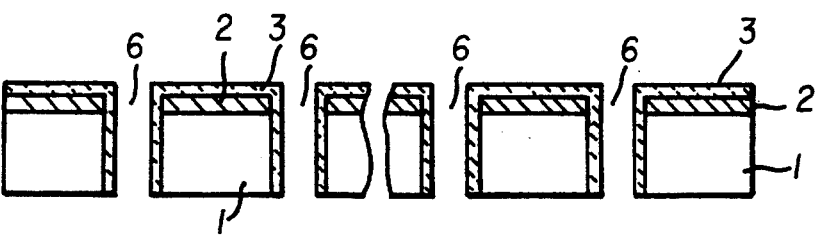
Figure 6E:
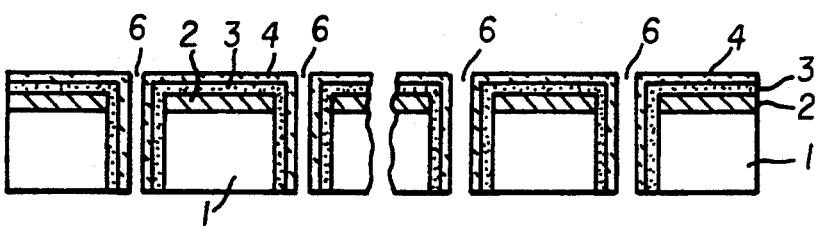
Figure 6F:
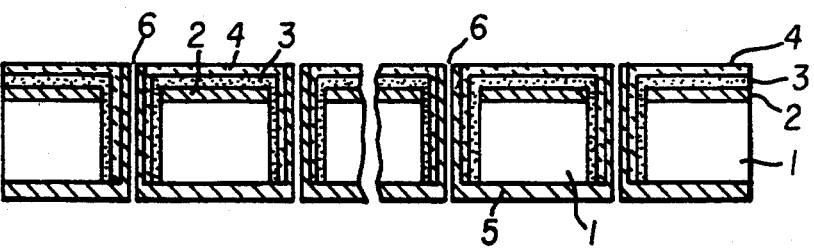
Figure 6G:
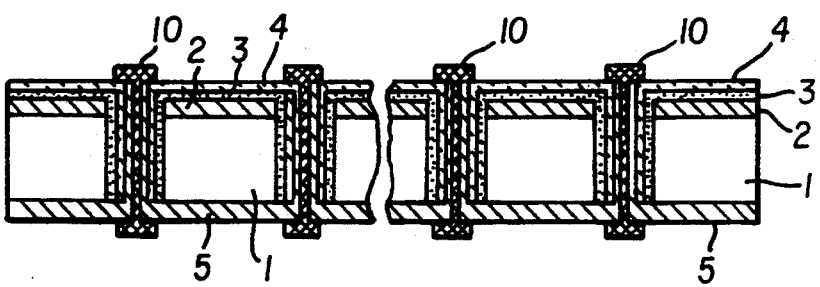

FIGS. 6(a) through (g) show the flow of the manufacturing processes of a thin-film solar cell according to still another embodiment of the present invention. In this embodiment, the first electrode layer 2, which is made of silver, is formed on the substrate 1 using a polyether sulfonic film with a thickness of 60 μm as shown in FIG. 6(b). Thereafter, the connecting holes 6 are formed using a punching device [FIG. 6(c)]. Next, the a-Si:H film [FIG. 6(d)] and the ZnO transparent electrode layer 4 [FIG. 6(e)] are formed, after which the third electrode layer 5 is formed on the rear side [FIG. 6(f)]. Furthermore, in order to make the electric connection via the through holes 6 more reliable, a low-melting point alloy 10 such as a highly conductive solder is introduced into the through holes 6 after the third electrode layer 5 has been formed on the rear side as shown in FIG. 6(g). Incidentally, it is possible to connect the transparent electrode layer 4 on the light incidence side with the third electrode layer 5 by using a conductor that passes through the connecting hole 6, while being insulated from the first electrode layer.

Figure 7:
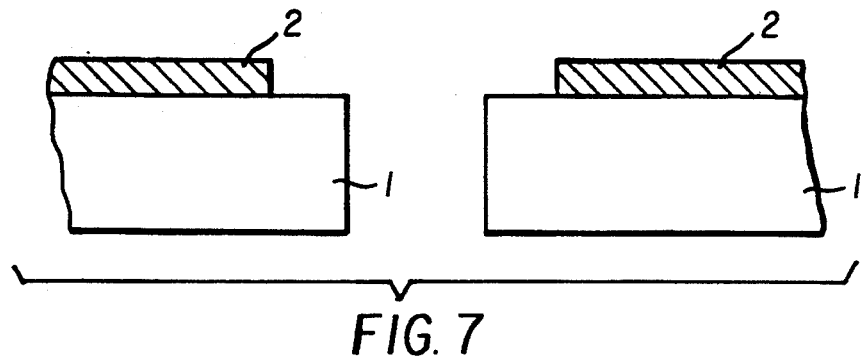
FIG. 7 is an expanded cross-sectional drawing showing portions in the vicinity of a connecting hole on the first electrode layer according to an embodiment of the present invention.
Figure 8:
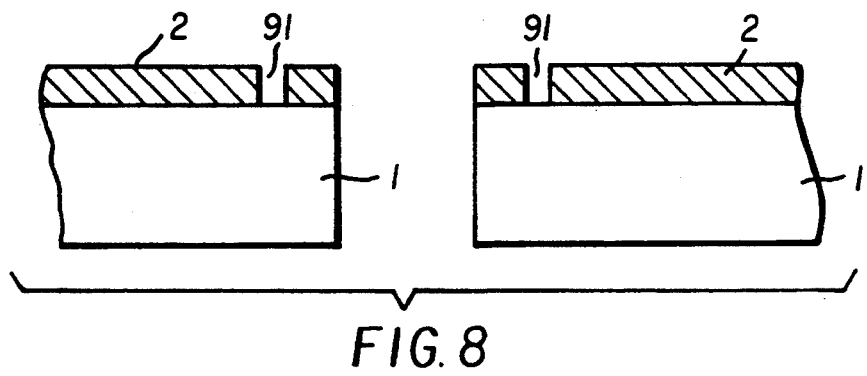
FIG. 8 is an expanded cross-sectional drawing showing portions in the vicinity of a connecting hole on the first electrode layer according to another embodiment of the present invention.

The embodiment shown in FIG. 6 eliminates the need for a process to remove the first electrode layer 2 deposited on the inner wall and the periphery of the connecting hole 6. However, in order to prevent the metallic electrodes from being shorted in the through hole 6, it is effective, as in the cross sections shown in FIGS. 7 and 8, to remove the electrode layer at the periphery of the hole on the face on which the solar cell is formed (FIG. 7) or remove a groove-formed portion 91 so that its pattern will be a closed curve (FIG. 8) by using a laser beam or etching process to separate the area around the hole from other parts, after the first electrode layer 2 has been formed on the substrate 1.

In solar cells according to the above embodiments, there is only one series connection regardless of the substrate area, and it is therefore possible to realize thin-film solar cells with a low-voltage and a large current. To obtain the desired high output voltage, it may generally suffice to connect the required number of solar cells in series. Depending on the application, it is conceivable that a solar cell, which has lower voltage than that in the conventional series connection solar cells but higher voltage than that in one unit cell on one substrate, is required. In such a case, it is possible to combine conventional technology with the present invention to split a whole solar cell into a number of cells as determined by the desired voltage, these cells being connected to each other in series using the conventional method.

Figure 1B:
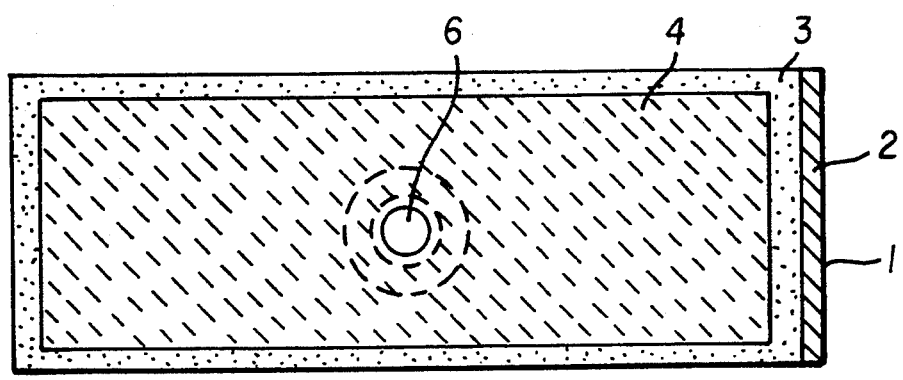
Figure 9A:
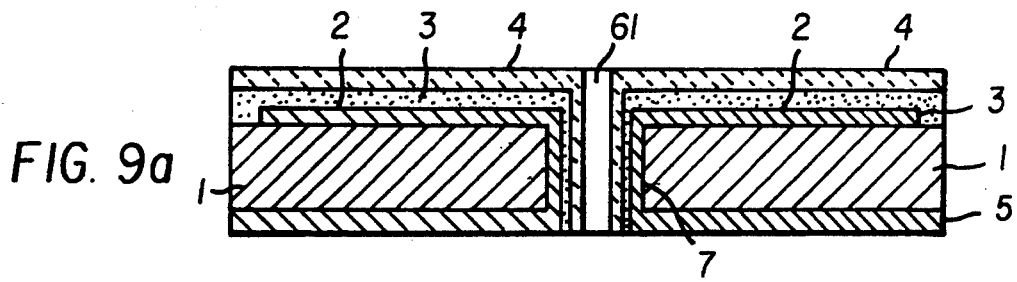
FIGS. 9(a) and (b) show a series-connection structure, according to an embodiment of the present invention, in cross-section, and in plan view.

FIGS. 9(a) and (b) show a construction which creates the series connection structure by combining a cell with the construction shown in FIG. 1, wherein the first electrode layer 2 is connected to the third electrode layer 5 via a linking portion in the connecting hole 61. To fabricate a cell with such a construction, a connecting hole 61 is first formed on the insulating substrate 1, and then the third electrode layer 5 is formed on the rear side while the first electrode layer 2 is formed on the front side. In this way, both layers are superimposed on the connecting hole and the linking portion 7 is formed. Thereafter, the amorphous semiconductor layer 3 and the second electrode layer 4 are laminated.

In this embodiment, the first electrode layer 2 was made a size smaller than the upper amorphous semiconductor layer 3 and the second electrode layer 4 by using a mask during the formation of the first electrode layer 2, as the cross sections shown in FIG. 9(a). This provides insulation between the edges of the first electrode layer 2 and the second electrode layer 4. The same effect may be obtained by using another method to separate the first electrode layer 2 by a laser-beam process at a site, which is a size shorter than the upper amorphous semiconductor layer 3 and the second electrode layer 4.

Figure 9B:
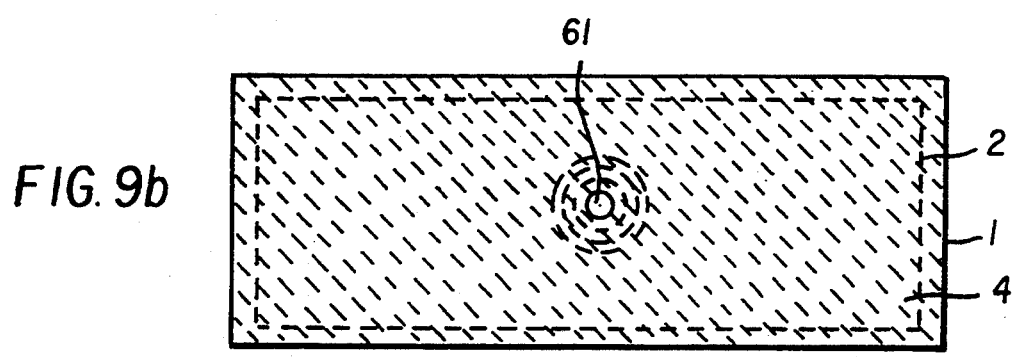
Figure 10A:
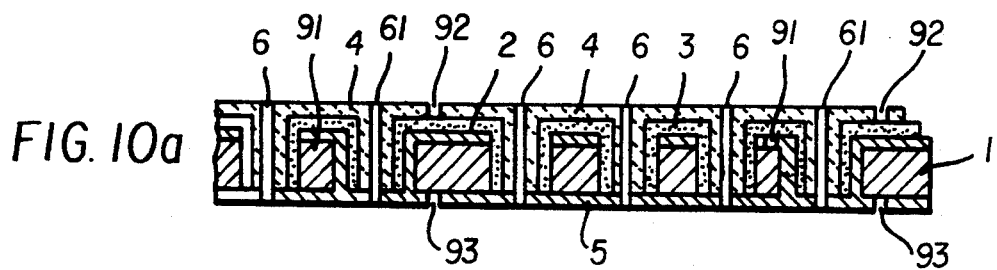
FIGS. 10(a) and (b) show a thin-film solar cell with a series-connection structure, according to an embodiment of the present invention, in cross-section, and in plan view.

FIGS. 10(a) and (b) show a thin-film solar cell that provides a higher output voltage from a series connection structure with a construction that combines those shown in FIGS. 1 and 9, wherein there are two types of connecting holes 6 and 61 formed on the insulating substrate 1. In the case of one connecting hole 61, the first electrode layer 2 is connected to the third electrode layer 5, as shown in FIG. 9, while in the case of other connecting hole 6, the second electrode layer 4 is connected to the third electrode layer 5, as shown in FIG. 1. With this construction, because the first electrode layer 2 opposite the amorphous semiconductor layer 3 and the second electrode layer 4 connected to the third electrode layer 5 in a cell in a region 81 are connected to the third electrode layer 5 in one region 82, and because its third electrode layer 5 is linked with the third electrode layer 5 in an adjoining cell in another region 83, the cell in one region 83 is connected in series with the cell in the other region 81. This thin-film solar cell is manufactured via the following process.

The substrate 1 made of a flexible 40-cm square polyethylene naphthalate film is drilled with connecting holes 61 with a diameter of 1 mm at 15-mm intervals using a metal punch, a stainless-steel film is formed to a thickness of 2500 Å on one face of the substrate using a sputtering process as a fourth corrosion resistant electrode layer, which is not shown, and a silver film is formed to a thickness of 1400 Å on the other face of the substrate using the sputtering process as used for the first electrode layer 2. Such a formation connects the first electrode layer 2 to the fourth electrode layer electrically. Then, the holes 6 are formed using a metal punch or a drill, and a linear portion 91 on the first electrode layer 2 in the vicinity of the holes 6 is removed using a laser-beam process. The amorphous semiconductor layer 3 as a power generating layer is formed thereupon via a plasma CVD process, and a ZnO film, which serves as the transparent second electrode layer 4, is formed thereupon to a thickness of 2 μm via a sputtering process. A stainless-steel film serving as the third electrode layer 5 is formed again on the rear side of the substrate which overlaps the fourth electrode layer using a sputtering process so that it contacts and is electrically connected to the amorphous semiconductor layer 3 and the second electrode layer 4 extending into the connecting holes 6 and 61. Finally, the linear portion 92 of the second electrode layer 4 and the linear portion 93 of the third electrode layer 5 are removed at the same locations on both the front and rear sides by using a laser-beam process.

This construction eliminates the need for a conventional patterning process requiring high accuracy. In addition, because the output drop caused by the sheet resistance in the second electrode layer 4 is not as large as that in a conventional construction, the output does not fluctuate substantially because of the solar cell widths, thereby enabling the current and voltage values of a solar cell to be set effectively.

Figure 10B:
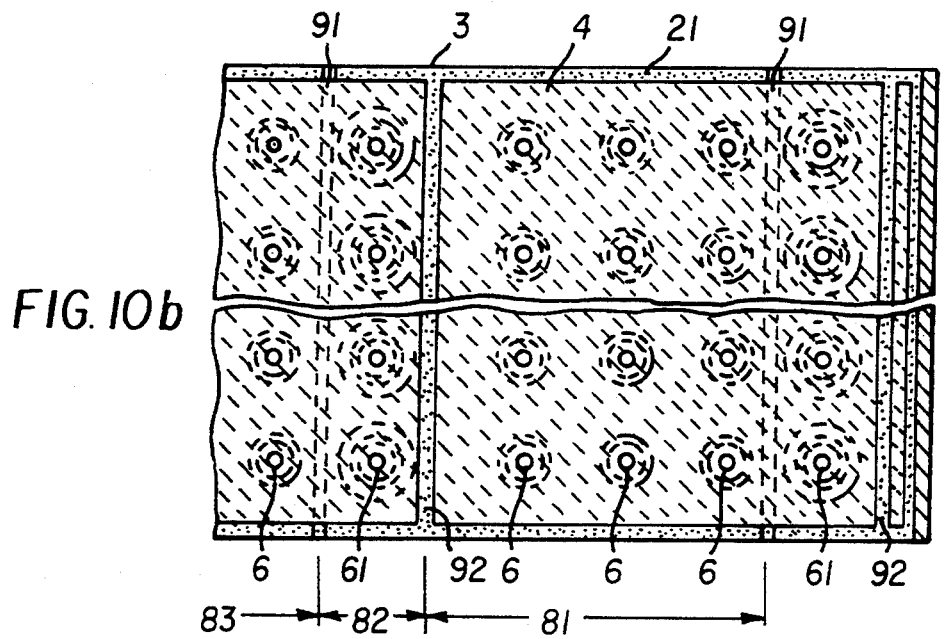
Figure 11A:
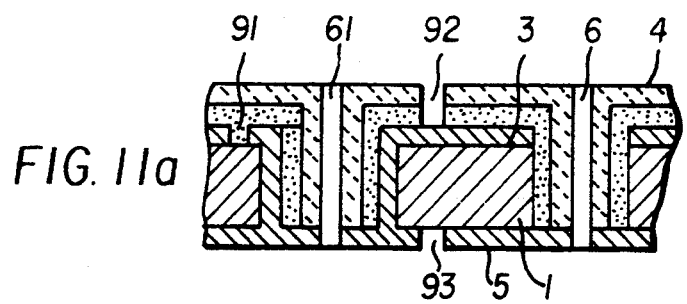
FIGS. 11(a) and (b) show an example of a series connection with thin-film solar cells according to an embodiment of the present invention, in cross-section, and in plan view.

In this embodiment, separation processing to obtain the series-connection structure was carried out via a YAG laser-beam process. A pulse laser with a basic wave of 1.06 μm was used as a processing laser, capable of processing as the base material not only the second electrode layer 4, but also the amorphous semiconductor layer 3 simultaneously as shown in FIGS. 11(a) and (b) in the portion 92 which has been removed linearly in the transparent second electrode, shown in FIG. 10. Processing means that can be used in this case may also include second harmonics, which can absorb the amorphous semiconductor layer 3 more easily even in the same YAG laser, or mechanical contact processing, which uses a knife or supersonic wave chip. Since these processes eliminate the need for selective processing of the transparent second electrode layer 4, stable electrical separation on the second electrode layer 4 is possible. It is also advantageous that mechanical contact processing requires lower equipment costs than laser-beam processing.

Figure 12A:
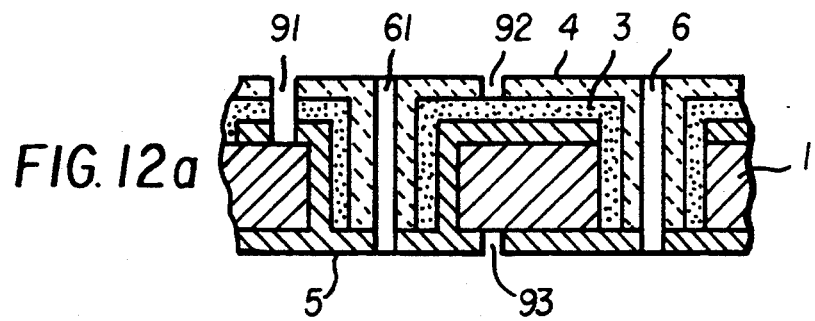
FIGS. 12(a) and (b) show another example of a series connection with thin-film solar cells according to an embodiment of the present invention, in cross-section, and in plan view.

FIGS. 12(a) and (b) show a process to linearly remove the linear portion 91 in the first electrode layer 2, which has a construction as shown in FIG. 4. This can be done after the third electrode layer 5 has been formed. Such a manufacturing process offers an advantage that, since no laser beam process is performed between the first electrode layer 2 and the amorphous semiconductor layer 3, no defects such as pin holes are generated, as typically occur during such processing, and since such removal is carried out after all the films have been formed, the removing process can be executed at the same time as the process to remove the linear portion 92 of the second- electrode layer 4 and the linear portion 93 of the third electrode layer 5.

Figure 13A:
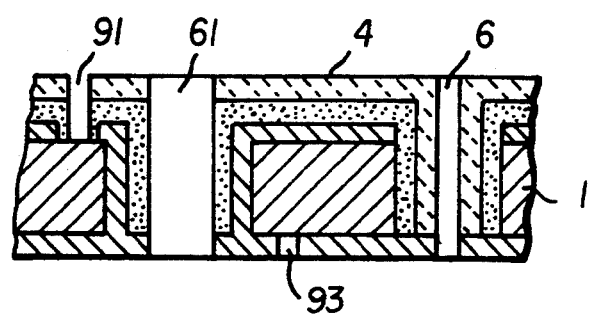
FIGS. 13(a) and (b) show another example of a series connection with thin-film solar cells according to an embodiment of the present invention, in cross-section, and in plan view.
Figure 13B:
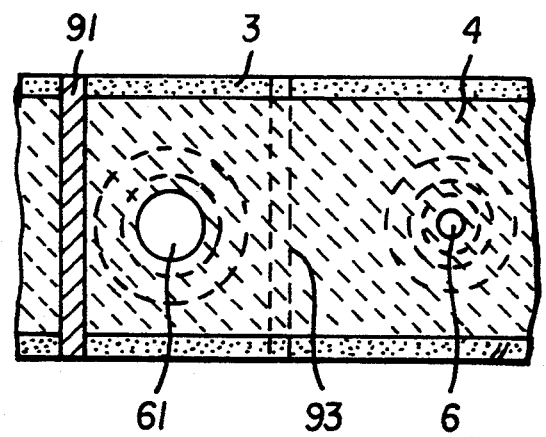

FIGS. 13(a) and (b) show a process in which the connection hole 61 is covered with a mask when the second electrode layer 4 is formed so that the second electrode layer 4 will not extend into the connection hole. In this way, it is possible to prevent the connection of the second electrode layer 4 with the third electrode layer 5 and the first electrode layer. This process eliminates the need to remove the linear portion 92. When the three layers (the first electrode layer 2, the amorphous semiconductor layer 3, and the second electrode layer 4) are removed simultaneously in the linear portion 91 in this construction, it is possible for the first electrode layer 2 to be electrically connected to the second electrode layer 4, thereby causing a degradation of the solar cell performance. To prevent such an occurrence, the first electrode layer is processed so as to make its width larger at the linear portion 91 before the amorphous semiconductor layer 3, the second electrode layer 4, and the third electrode layer 5 are formed sequentially. Then the second electrode layer 4 and the amorphous semiconductor layer 3 are processed simultaneously at the part of the first electrode layer 2 which has the larger width. In executing this process it is important not to expose the first electrode layer 4 to the side furthest from the connection hole 61 on the removed linear portion 91. Adopting such a construction prevents the first electrode layer 2 in an adjoining cell from electrically contacting the third electrode layer 4 during the process to remove the linear portion 91.

Figure 11B:
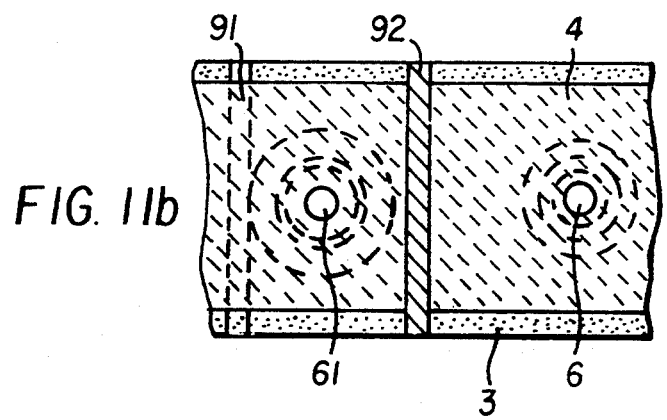
Figure 12B:
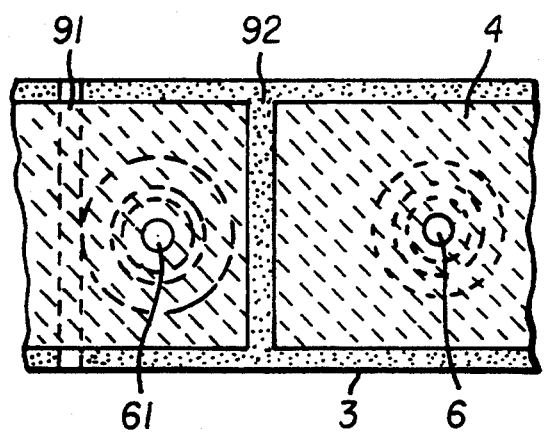
Figure 14A:
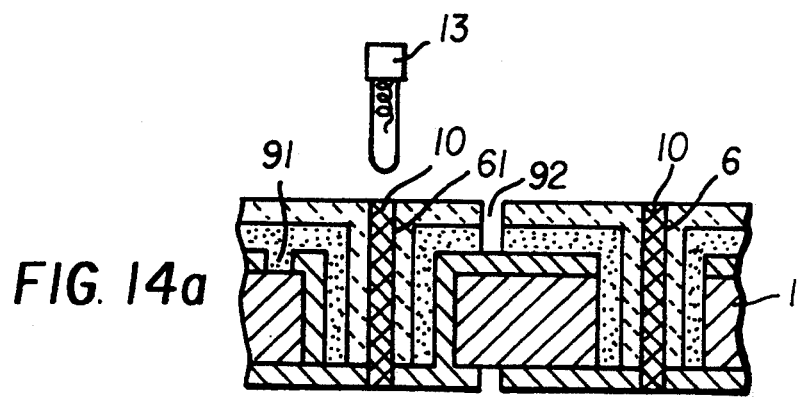
FIGS. 14(a) and (b) show another example of a series connection with thin-film solar cells according to an embodiment of the present invention, in cross-section, and in plan view.
Figure 14B:
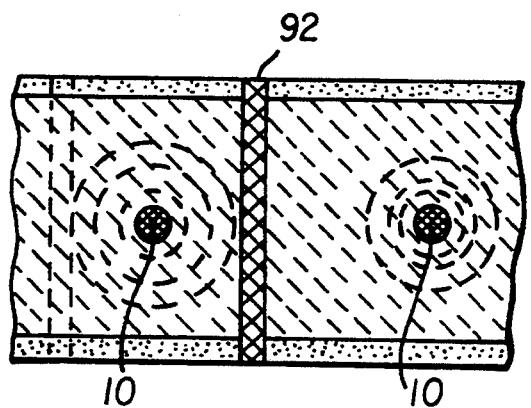

FIGS. 14(a) and (b) show a process in which, after the construction shown in FIG. 11 has been formed, the first electrode layer 2 is brazed with the third electrode layer 5, and the second electrode layer 4 is brazed with the third electrode layer 5 while solder 10 is poured into two connecting holes 61 and 6, respectively, using a supersonic soldering iron 13 to strengthen the electric connection between the second electrode layer 2 and the third electrode layer 5 through one connecting hole 61 and between the second electrode layer 4 and the third electrode layer 5 through the other connecting hole 6. Supersound improves the wettability of the solder on the transparent electrode layer 4. This process of strengthening the electric connection in the connecting hole 61 and the connecting hole 6 using the solder 10 may be applied to the constructions shown in FIGS. 10 and 12.

Figure 15A:
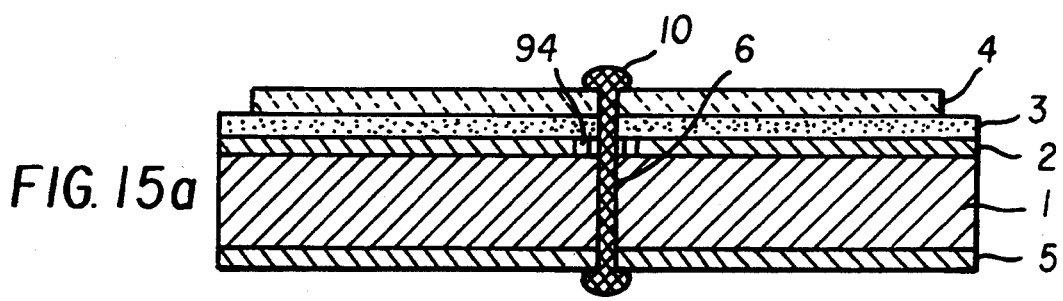
FIGS. 15(a) and (b) show another example of the construction in FIG. 1, in cross-section, and in plan view.
Figure 15B:
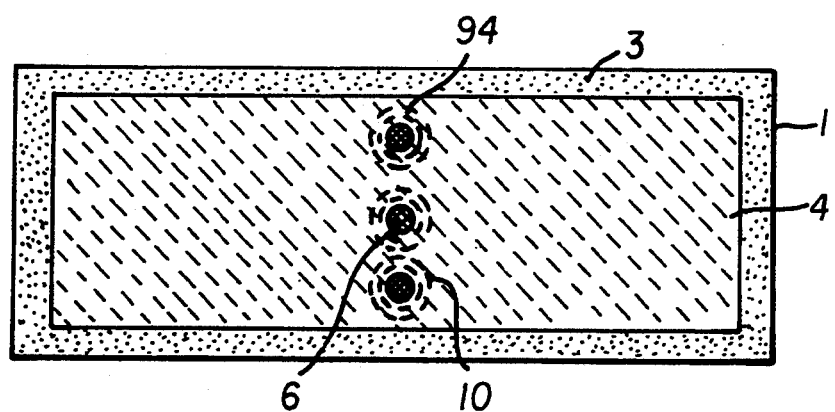
Figure 16A:
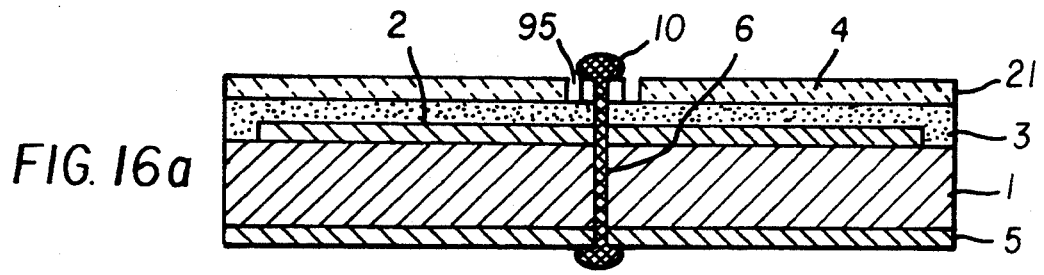
FIGS. 16(a) and (b) show another example of the construction in FIG. 9, in cross-section, and in plan view.
Figure 16B:
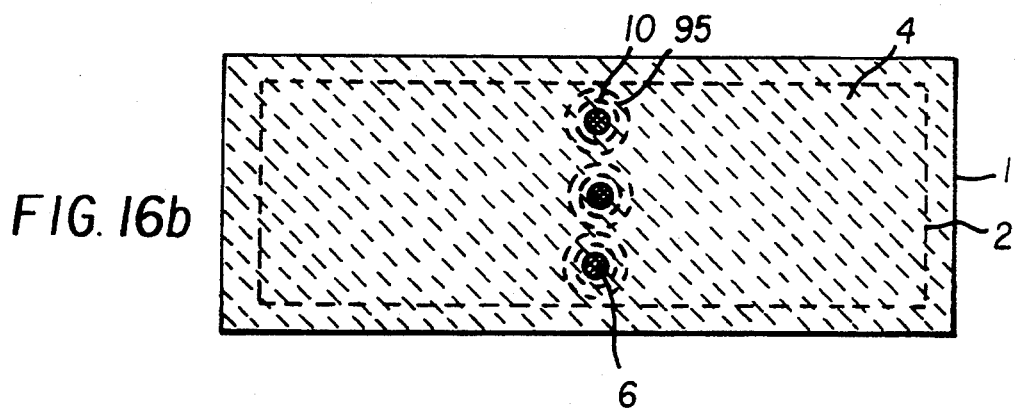

FIGS. 15(a) and (b) and FIGS. 16(a) and (b) respectively show cross sections of a thin-film solar cell, wherein, with respect to the constructions in FIGS. 1 and 9, the second electrode layer 4 is brazed with the third electrode layer 5, and the first electrode layer 2 is brazed with the third electrode layer 5 together with the solder 10 using a supersonic soldering iron with a diameter of 1 mm when the connecting hole 6 is formed in the substrate 1. The first electrode layer 2 is insulated from the second electrode layer 4 by trimming the annular groove 94 in FIG. 15 and the second electrode layer 4 is insulated from the first electrode layer 2 by trimming the annular groove 95 in FIG. 16. According to this process, since no connecting holes 6 or 6 and 61 need be formed before the amorphous semiconductor layer 3 is formed, problems such as separation of the film on the amorphous semiconductor layer 3 due to a change in the shape of the substrate will occur while the connecting holes are being formed. In addition, holes can be formed and connected in one step, which serves to simplify the manufacturing process.

Figure 17:
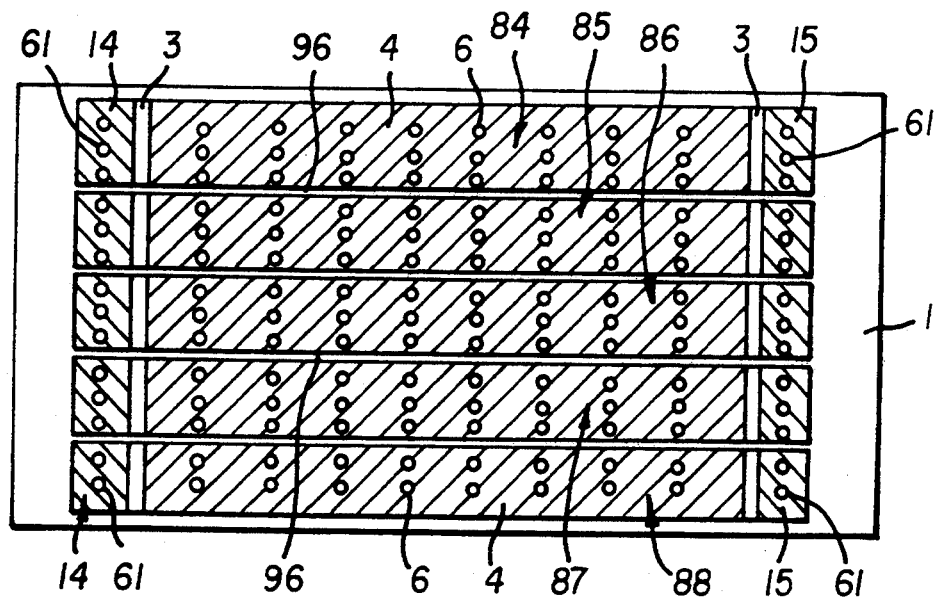
FIG. 17 is a plan view showing a thin-film solar cell with a series-connection structure according to another embodiment of the present invention.

A thin-film solar cell with a series-connection structure can be manufactured with the manufacturing process shown in FIG. 6 if the following methods are applied. After a solar cell construction is formed on a substrate 1 with a large area according to the forming procedure shown in FIGS. 6(a) through (f), the solar cell is split into several solar cells, which are electrically insulated from each other (hereinafter referred to as the cells) 84, 85 and -88, by forming grooves 96 created by linearly removing the formed layers at a predetermined interval as per the plan view shown in FIG. 17. This embodiment uses a YAG laser in this removal process. In addition, as shown in FIG. 17 and the cross section in FIG. 18, regions that are not covered with the thin-film semiconductor layer 3 in the first electrode layer 2 and with the second electrode layer 4 (non-covered regions) 14 and 15 are initially formed, and at this site the connecting holes 61 are also formed. Furthermore, the third electrode layer 5 formed on the side opposite the face on which the solar cell is formed is formed so as to include the portions of the connecting holes 61 formed on at least the non-covered regions 14 and 15, as shown. When films are deposited via a conventional film-forming process such as a sputtering process, the first electrode layer 2 and the third electrode layer 5 are electrically connected by depositing the latter on the inner walls of the through holes 61. Thereafter, the third electrode layer 5 is linearly removed in a way forming a front and back relationship with cells formed on the opposite side. As a result, grooves 97 are formed and the solar cell is split as shown in FIG. 19. However, the third electrode layer 5 on the face opposite the non-covered regions on the front side is split so that it is linked with the third electrode layer 5 on regions that include the through holes of the adjoining cells. As a result, one transparent electrode 4 in the cells 83 and -88, which adjoin one another via the non-covered regions, is connected in series with the first electrode layer 2 in the other cells. Hence a construction, in which various cells are sequentially connected in series on the substrate, is formed. The non-covered regions forming the series connection need not be present at both ends; however, if various such non-covered regions 16 are formed in the middle of the solar cell as shown in FIG. 20, joule loss due to the flow of a current through the third electrode layer 5 can be avoided even if the length of the cell is extended.

Figure 18:
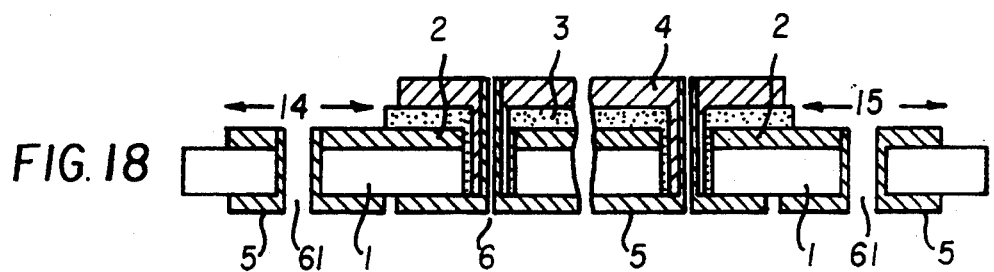
FIG. 18 is a cross-sectional view showing the thin-film solar cell in FIG. 17.
Figure 19:
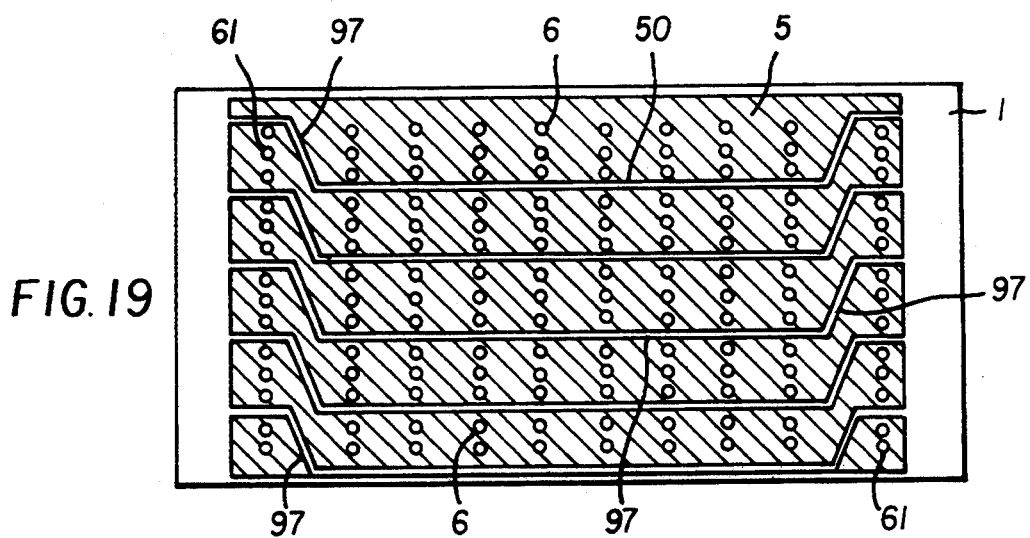
FIG. 19 is a bottom view showing the thin-film solar cells in FIGS. 17 and 18.
Figure 20:
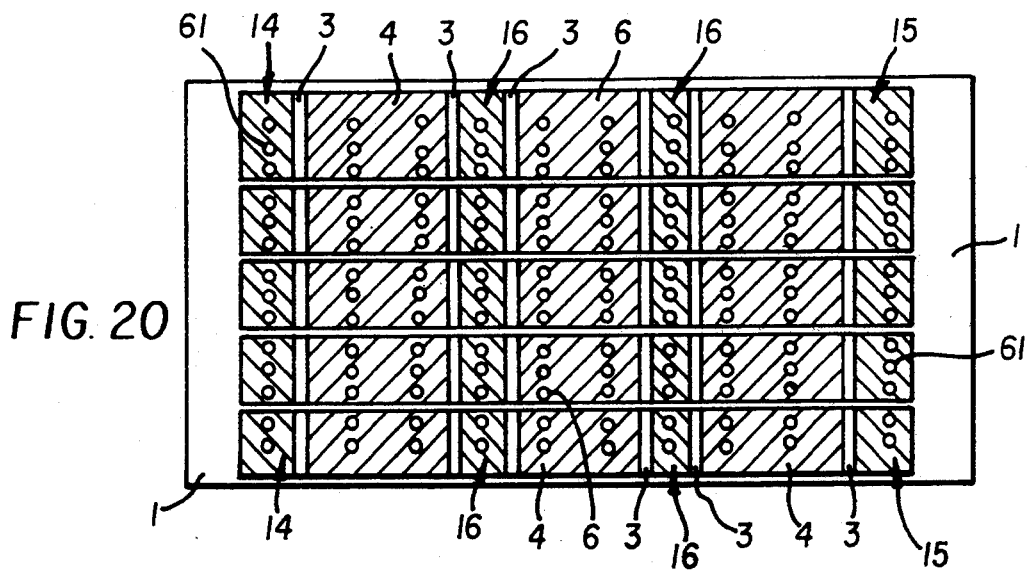
FIG. 20 is a plan view showing a thin-film solar cell with a series-connection structure according to a different embodiment of the present invention.

When manufacturing thin-film solar cells with the series connection structure shown in FIGS. 17, 19, and 20, it is necessary to form non-covered regions 14 and 15 on the through holes 61 at the edges to create a series connection when forming the semiconductor layer 3. To meet this requirement, the semiconductor layer 3 is formed with a mask attached onto it. However, it is difficult to form the same element structure at its end portions as that at its center. In other words, in a semiconductor layer made of amorphous silicon, for example, a junction is laminated with a p-layer, an i-layer, and an n-layer to form the basic element structure. Moreover, in order to improve the conversion efficiency these layers are sequentially formed in separate film-forming chambers to prevent the three layers from being contaminated by the respective dopant impurities. It is practically impossible at this time to set the substrate and to construct the junction without positionally shifting its edge in one of the film-forming chambers. In addition, if the layers are formed by, for example, a process such as the glow discharge decomposition process, the film thickness and the film characteristics in the vicinity of the mask will vary greatly from those of the central portion. As a result, no junction structure as intended by the design will be formed at the edges even if the substrate has been positioned precisely. As a result, the semiconductor layer 3 works simply as a resistor at these portions, causing the first electrode 2 and the second electrode 4 to be shorted. If these problems are to be avoided, the size of the layers laminated on the semiconductor layer 3 and the second electrode layer 4 formed thereupon must be reduced in the formation sequence shown in FIG. 18. However, this will not increase the effective power-generating area of a solar cell.

FIGS. 21(a) through (g) show an embodiment that corrects the above problems, following the flow of the manufacturing process. The substrate is an Aramid film with a thickness of 60 μm [FIG. 21(a)]. Holes 61 are formed on the substrate 1 at certain intervals using a punch [FIG. 21(b)].

Figure 21A:
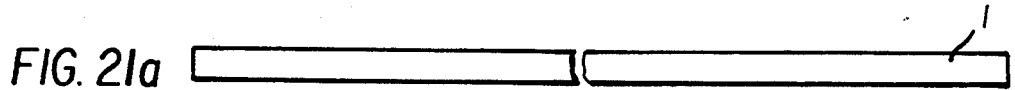
FIGS. 21(a) to (g) show cross-sectional views of the manufacturing processes of thin-film solar cells with a series-connection structure according to another embodiment of the present invention.
Figure 21B:
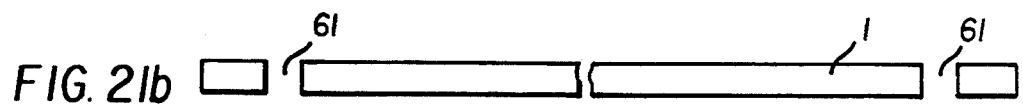
Figure 21C:
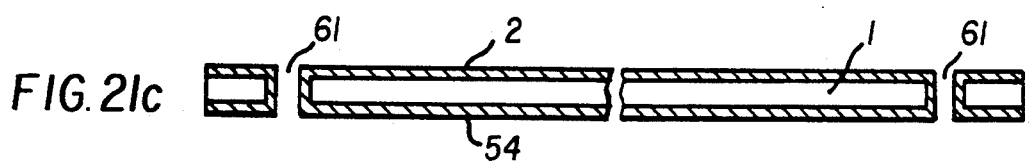
Figure 21D:
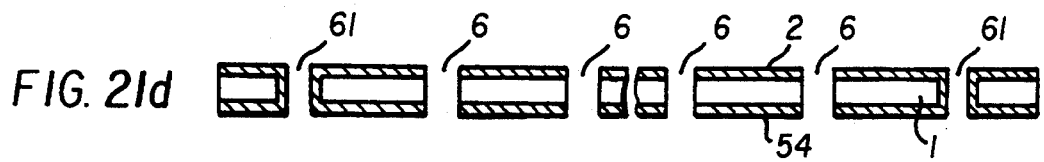
Figure 21E:
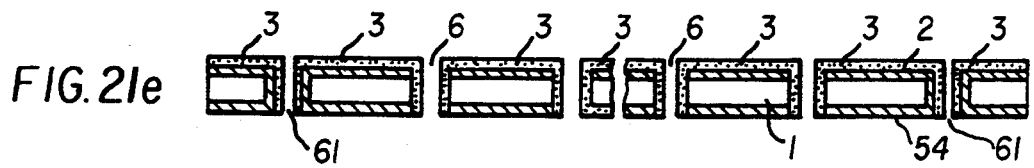
Figure 21F:
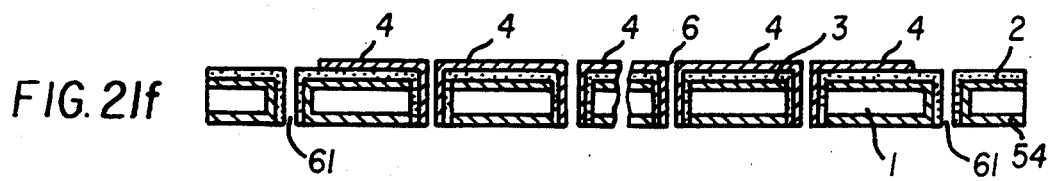
Figure 21G:
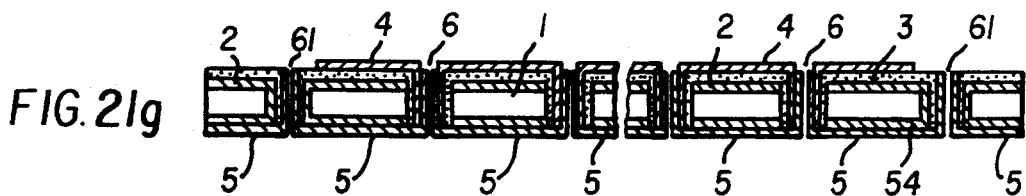
Figure 22:
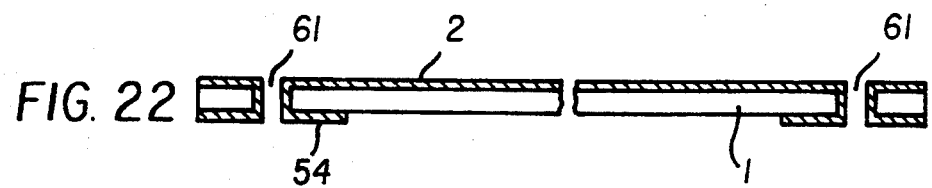
FIG. 22 is a cross-sectional view showing another example of the manufacturing process presented in FIG. 21(c).

Silver films are formed to a thickness of several hundred nm on the substrate as the first electrode layer 2, as well as on its opposite face as a fourth electrode layer 54 [FIG. 21(c)]. The forming sequence may start from any one of the faces. As a result of wrapping the material around the through holes 61 during the forming process, the electrical connection between the first electrode layer 2 and the fourth electrode layer 54 will result in a value as low as is practically necessary. In addition, the film-forming method need not be limited to a sputtering process. Rather, a deposition method may also be used. Furthermore, as shown in FIG. 22, this fourth electrode layer 54 need not be formed entirely on the rear face, but rather may be formed to partially include the communicating regions. Holes 6 were formed over the entire area of the substrate using the method described above [FIG. 21(d)].

After these processes are completed, the thin-film semiconductor layer 3 is formed to serve as a photoelectric conversion layer. In this embodiment, a hydrogenated amorphous silicon (a-Si:H)-based material deposited by the conventional glow discharge decomposition process is used to form an n-i-p junction [FIG. 21(e)]. Since the semiconductor layer 3 is formed entirely on the substrate in this case, no edge problem occurs. The transparent electrode layer 4 is formed thereupon as a second electrode layer via a sputtering process that uses a mask except on the through hole 61 portions. Finally, the third electrode layer 5, which is made of a low resistance conductive film such as a metallic film, is formed on the opposite side of the substrate face on which the solar cell was formed. This third electrode layer 5 contacts the fourth electrode layer 54 and is connected to it electrically. In this embodiment, aluminum is used as the material, and the film is formed using a sputtering process [FIG. 21(g)].

In a solar cell formed through the above processes, material is wrapped around portions of the through holes 6 and 61 during the film-forming process. For this reason, the transparent electrode layer 4 is electrically connected to the metallic layer 5, which is finally formed on the rear face of the holes. The in-plane distribution and density of the connecting holes 6 and 61 are set appropriately so that the voltage drop due to contact resistance with a current flowing through one hole can be neglected. In this case, to make the electrical connection at the through holes more reliable, a material with good conductivity such as a solder is introduced into the holes after the electrode layer has been formed on the rear face as shown in FIG. 6(g).

Using such a method means that the semiconductor layer 3 no longer needs to be formed in small regions closer to the first electrode layer 2, as shown in FIG. 18, by initially forming the through holes so that the first electrode layer 2 is connected to the third electrode layer 5, and initially forming the fourth electrode layer 54 on which the third electrode layer 5 is superimposed through the through holes in a subsequent process. Therefore, a defect such as a short circuit due to defects in the peripheral parts, a problem which occurs during the formation of semiconductor junctions, is eliminated. In addition, since what defines the effective area in a solar cell is only the second electrode layer 4, positioning restrictions are reduced, which facilitates an increase of the effective area. Furthermore, since the fourth electrode layer 54 is formed before the semiconductor layer 3 is formed, there is no risk of causing a degradation of characteristics in the amorphous semiconductor layer during the forming process, which in turn eases restrictions on substrate temperatures. Therefore, the fourth electrode layer 54 can be formed with a substrate temperature of 250° C. or higher by, for example, using a sputtering process. This results in a great advantage because as the substrate temperature increases, the adhesion force between the films and the electrodes also increases.

Figure 23A:
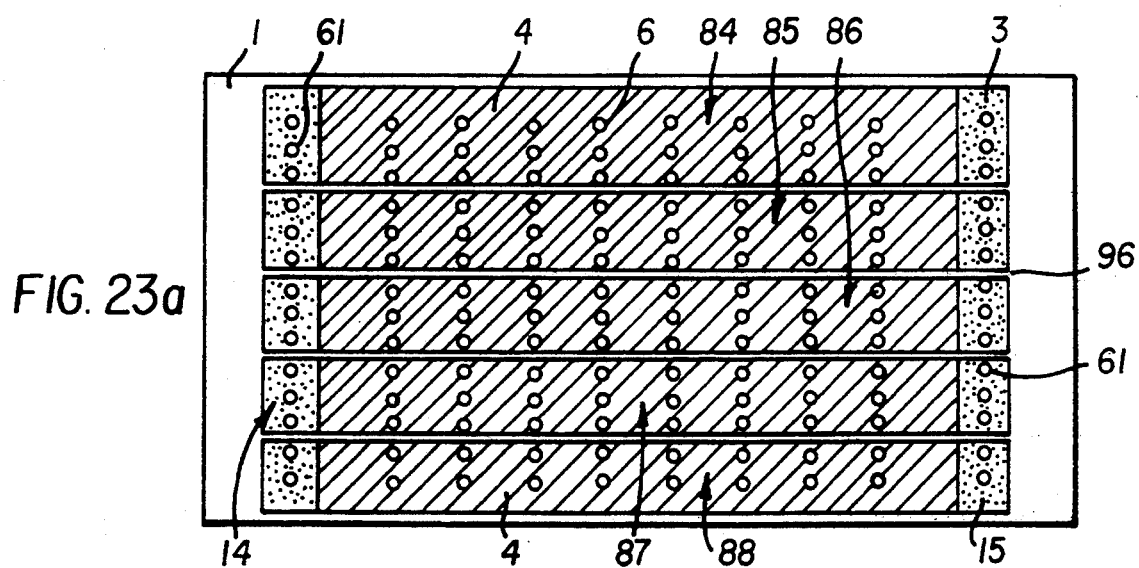
FIGS. 23(a) and (b) show a solar cell with a series-connection structure, according to another embodiment of the present invention, in plan view, and in bottom view.
Figure 23B:
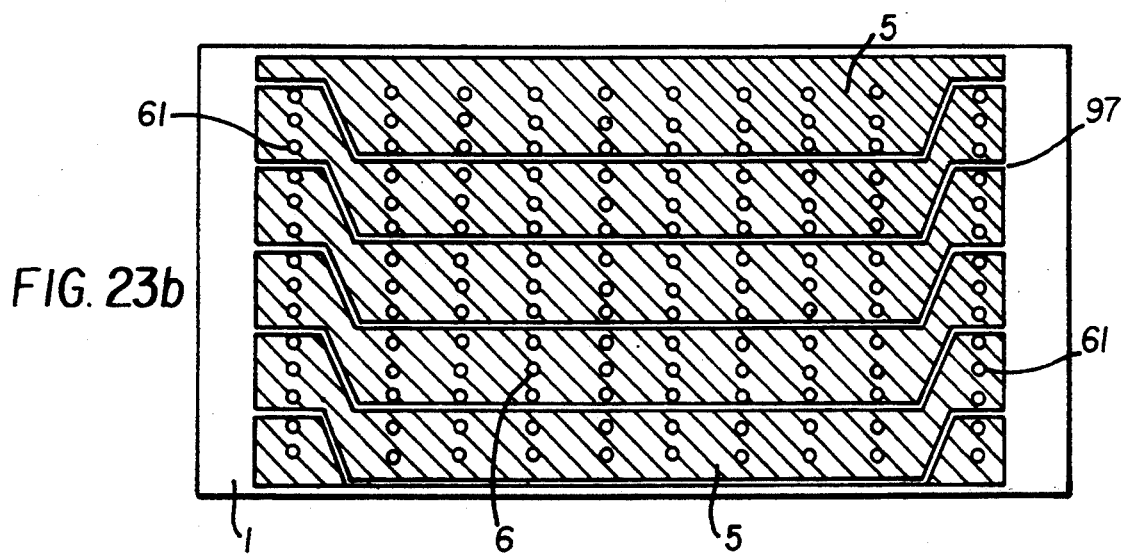

To create a series-connection structure, laser patterning is performed on the light-incidence face, as shown in FIG. 23(a), and on the rear face, as shown in FIG. 23(b). This pattern is the same as that in FIGS. 18 and 19, except that the non-covered region 14 and the amorphous semiconductor layer 3 are exposed.

Figure 24A:
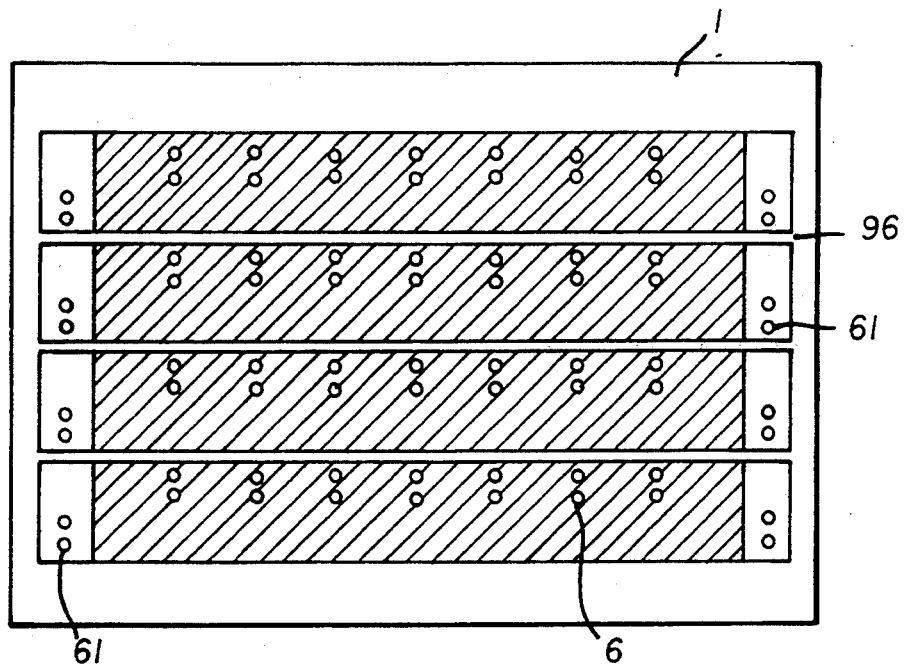
FIGS. 24(a) and (b) show a solar cell with a series-connection structure, according to another embodiment of the present invention, in plan view, and in bottom view.
Figure 24B:
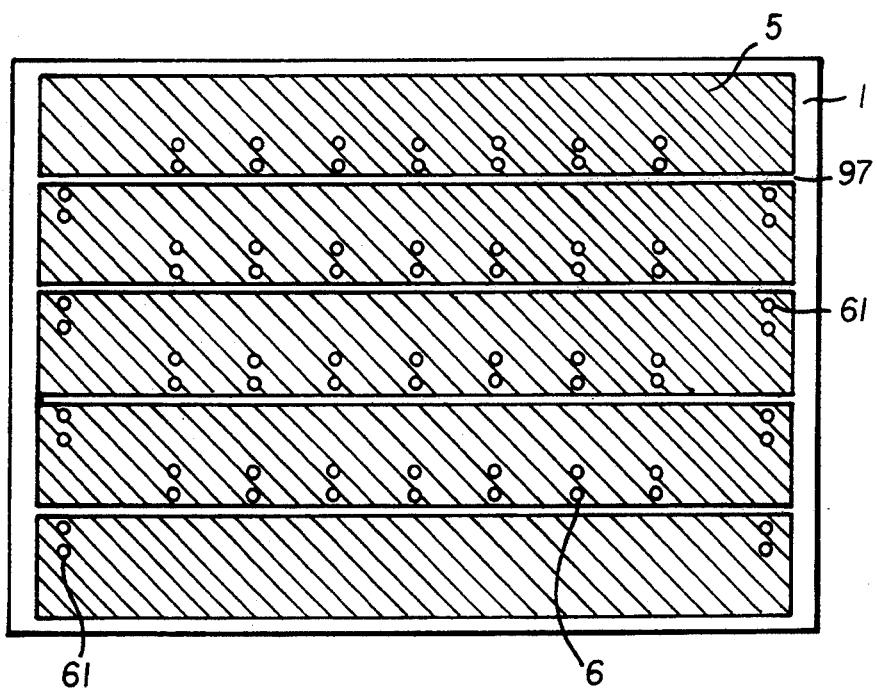

With such a construction, the pattern shown in FIG. 23(b) must be formed during the patterning process for the third electrode layer 5, and two-dimensional sweeping in the X-Y direction becomes necessary during laser-beam processing, for example. These requirements lead not only to increasing equipment costs, but also to decreasing processing speed. One embodiment which solves this problem is shown in FIGS. 24(a) and (b). FIG. 24(a) is a plan view of a light-incidence face, while FIG. 24(b) is a plan view of the face of the third electrode layer 5. Through holes 61 to connect the first electrode layer 2 to the third electrode layer 5, and through holes 6 to connect the second electrode layer 4 to the third electrode layer 5 are formed as shown. That is, a cell is split into two regions in a straight line parallel to the direction that perpendicularly crosses the direction in which the cell is connected in series, wherein the through holes 61 used to connect the first and third electrode layers are formed on one of the regions, and the through holes 6 used to connect the second and third electrode layers are formed on the other region. Adopting this type of construction makes it possible to form a series-connection structure by splitting the two faces with a linear pattern. For this reason, patterning devices can be simplified and their processing speed can be increased. In this case, the region in the third electrode 5 on the rear face is shifted by as much as half the width of the solar cell on the front face in its series-connection direction, and protrudes by half its width at both ends. Although the characteristics of the solar cell are only slightly affected even if these portions are missing, these portions can be utilized to connect leads that will draw out the output, for example.

Figure 25A:
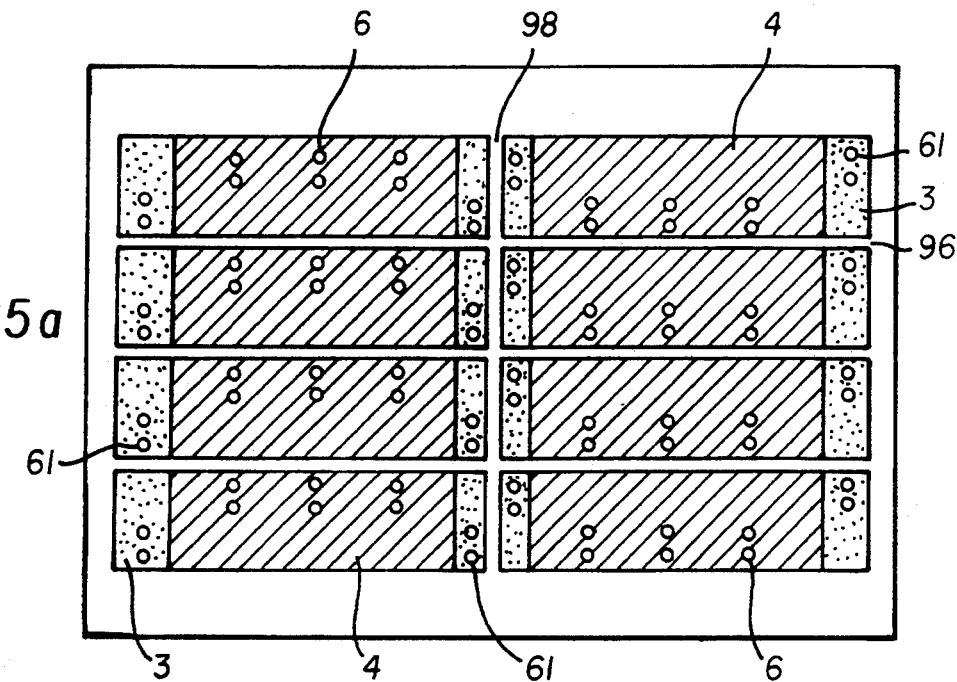
FIGS. 25(a) and (b) show a solar cell with a series-connection structure, according to another embodiment of the present invention, in plan view, and in bottom view.
Figure 25B:
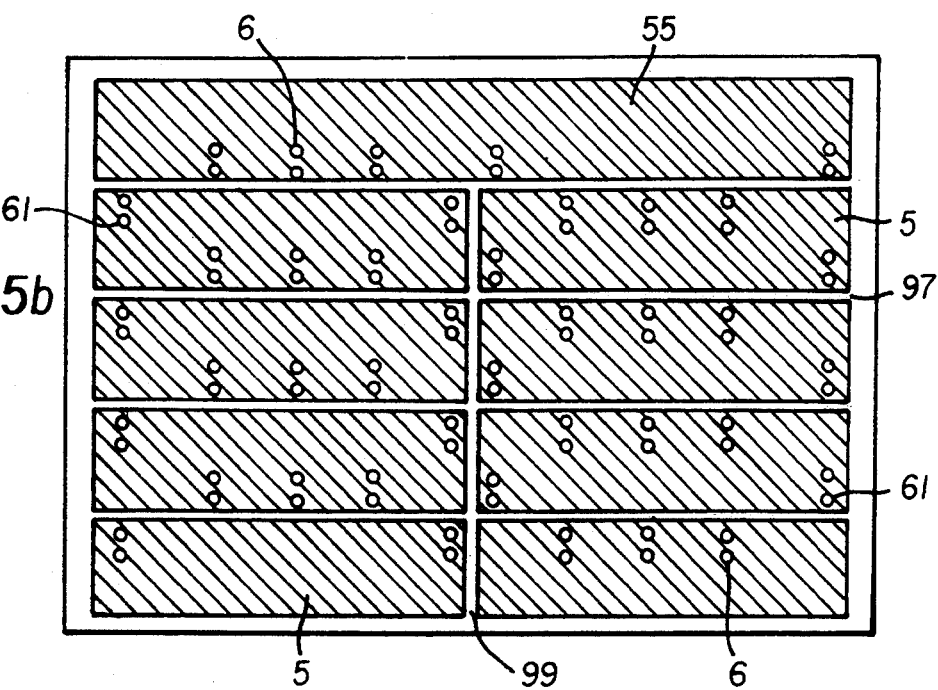

FIGS. 25(a) and (b) show one embodiment capable of drawing out a high voltage from a substrate of a predetermined size, wherein cells are built in two rows by a removed portion 98 perpendicular to the other removed portions 96, as shown in FIG. 25(a), and the third electrode layer 5 on the rear face is also split into two rows by a removed portion 99 except in the region 55 on the edge, as shown in FIG. 25(b). However, by reversing the positions of the through holes 6 and 61 in the two rows of cells, a total of eight cells can be connected in series.

Figure 26A:
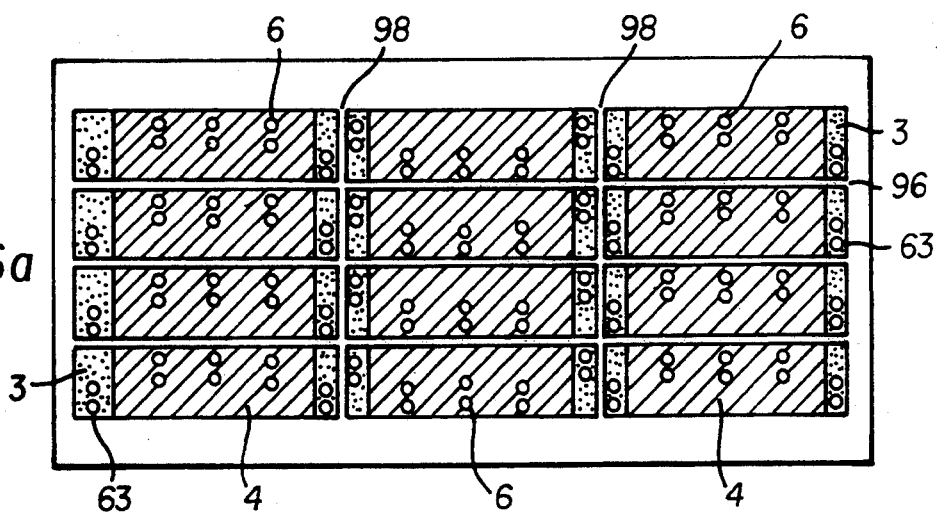
FIGS. 26(a) and (b) show a solar cell with a series-connection structure, according to another embodiment of the present invention, in plan view, and in bottom view.
Figure 26B:
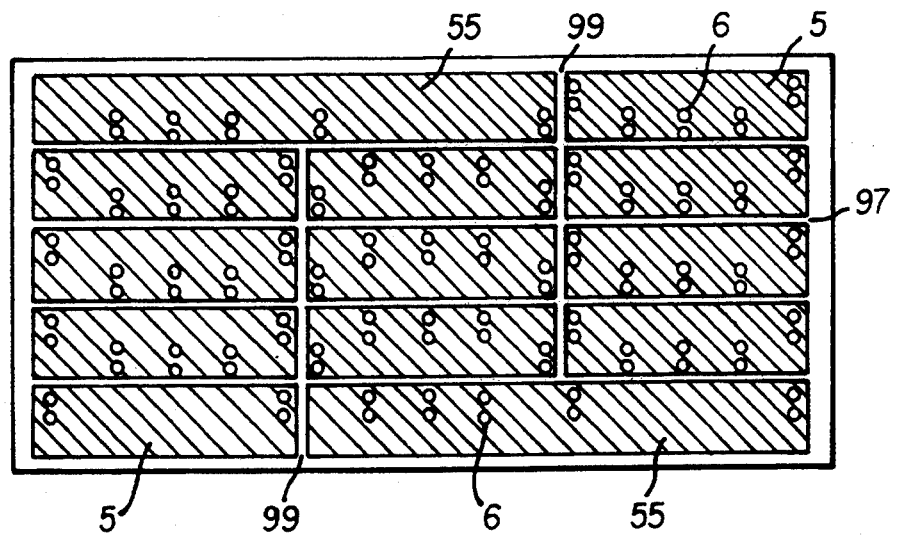
Figure 27A:
FIGS. 27(a) to (h) show cross-sectional views of the manufacturing processes of thin-film solar cells with series-connection structures according to still another embodiment of the present invention.
Figure 27B:
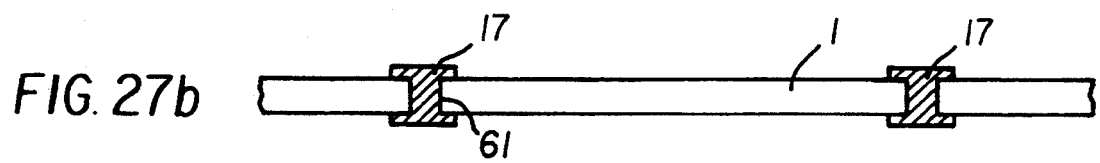
Figure 27C:
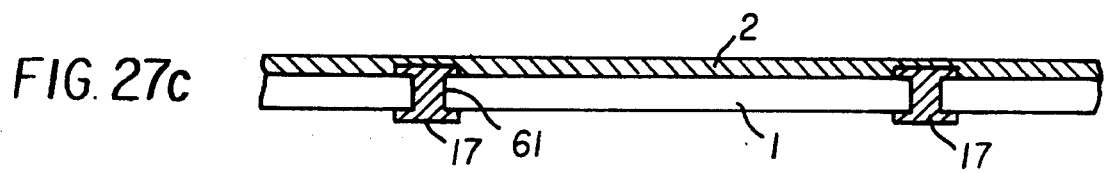
Figure 27D:
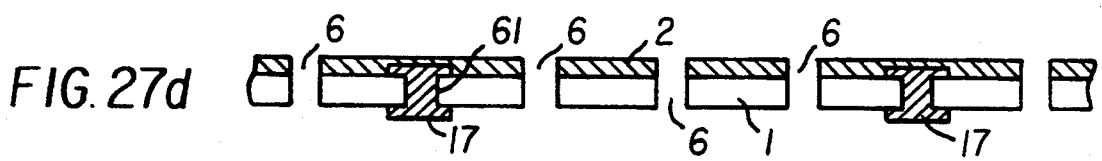
Figure 27E:
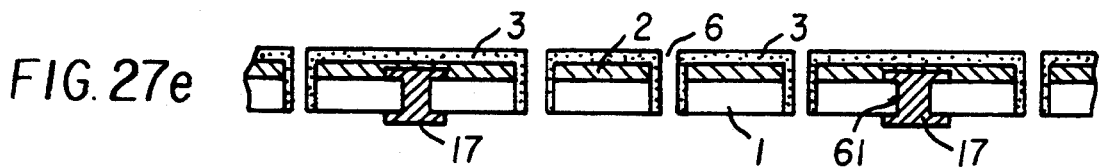
Figure 27F:
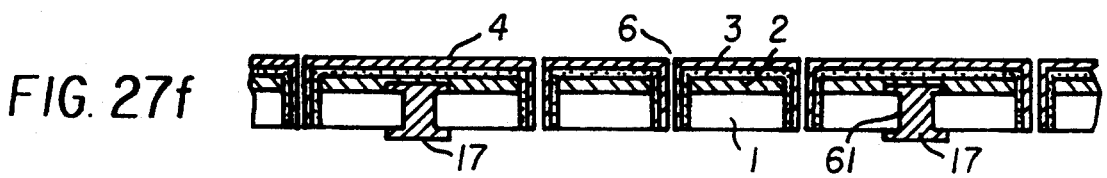
Figure 27G:
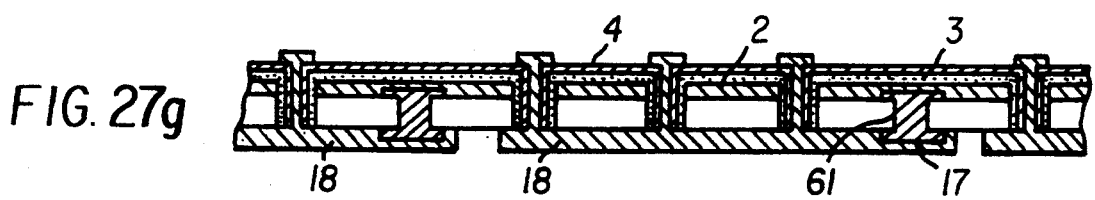
Figure 27H:
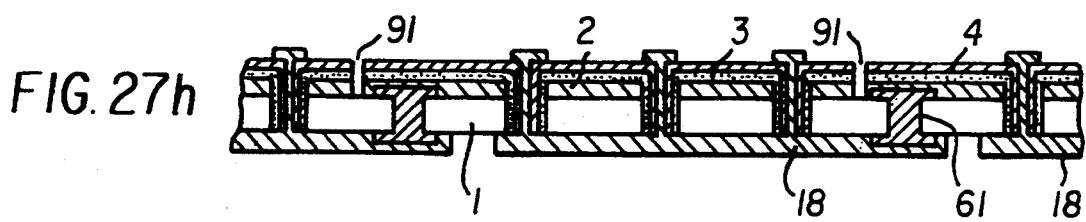

In the embodiment shown in FIG. 26, the cells on both faces are split by two removed portions 98 and 99, making three rows of cells, each connected in series. It goes without saying that this construction can be easily expanded to a construction having four rows or more. Such a construction can also be applied to the one shown in FIG. 19, although the shape of the pattern in the third electrode layer 5 is not linear.

Solar cells with these types of constructions can be manufactured by basically applying the same sequence that is illustrated in FIG. 22. However, the positions of the holes piercing the substrate must be determined as shown in FIGS. 25 and 26 depending on how many rows of cells a solar cell will ultimately be divided. In addition, when forming the second electrode layer 4 the regions, on which the through holes 61 are formed, must be covered with masks so that no films are formed. The third electrode layer 5 is made larger than the first electrode layer 2 on the other side. Thereafter, the first electrode layer 2, the semiconductor layer 3, and the second electrode layer 4 are simultaneously removed by a laser beam or an etching process, and the solar cell is divided into several cells. In the third electrode layer, a solar cell is split into cells, which are then connected in series using a laser beam or an etching process, except for the electrode on the edge that is required to connect the rows to each other.

A construction that provides a high output voltage can thus be realized without increasing manpower. As a result, it is not necessary to increase the number of splits by greatly reducing the width of a solar cell as when drawing out a high voltage from a single row. This allows more freedom of design while improving the effective area.

FIGS. 27(a) through (h) show the flow of the manufacturing process for a solar cell with the series-connection structure of another embodiment of the present invention. First, through holes 61 are formed on the insulating flexible substrate 1 [FIG. 27(a)] in the same manner as in the aforementioned embodiment. The diameter of these through holes 61 must be larger than 0.1 mm and smaller than 10 mm, and preferably larger than 0.1 mm and smaller than 5 mm. Thereafter, a printed electrode 17 to establish contact is formed using a printing process [FIG. 27(b)]. Either face of the substrate, or even both faces, may be printed on. In this process it is important for the printing to fill up the connecting holes. After the hole forming process, the first electrode 2 is formed by applying a metal-sputtering process or a deposition process [FIG. 27(c)], and then the through holes 6 are formed [FIG. 27(d)]. Next, the semiconductor layer [FIG. 27(e)] and the transparent electrode layer [FIG. 27(f)] are formed sequentially. Thereafter, a printed electrode pattern 18 filling up the through hole is formed by two face or one-face printing to connect the transparent electrode layer 4 as a second electrode layer and the printed electrode 18 as the third electrode layer [FIG. 27(g)]. Finally, the first electrode layer 2, the semiconductor layer 3, and the transparent electrode layer 4 are separated at the removed portions 91 to complete the construction of the thin-film solar cell [FIG. 27(h)]. The sequence of the final two processes, that is, the formation of the printed electrode 18 and the separation processing, may be reversed. It is also possible to perform the first hole 61 forming process and the process to fill up the hole 61 by using the printed electrode 17 after the first electrode 2 has been formed. This method allows the top of the through holes 61 to be used as a photoelectric conversion region by filling up the former via the printed electrode 17. Making the connection with the transparent electrode 4 by using the printed electrode 18 has greatly reduced defects such as short circuits in the first electrode 2, etc. as compared with the case in which the electrode layers are connected at the extended portions. In addition, since the first electrode 2 is a metallic electrode, and has low resistance the through hole 61 may be disposed the minimum number of holes required will suffice.

Figure 28A:
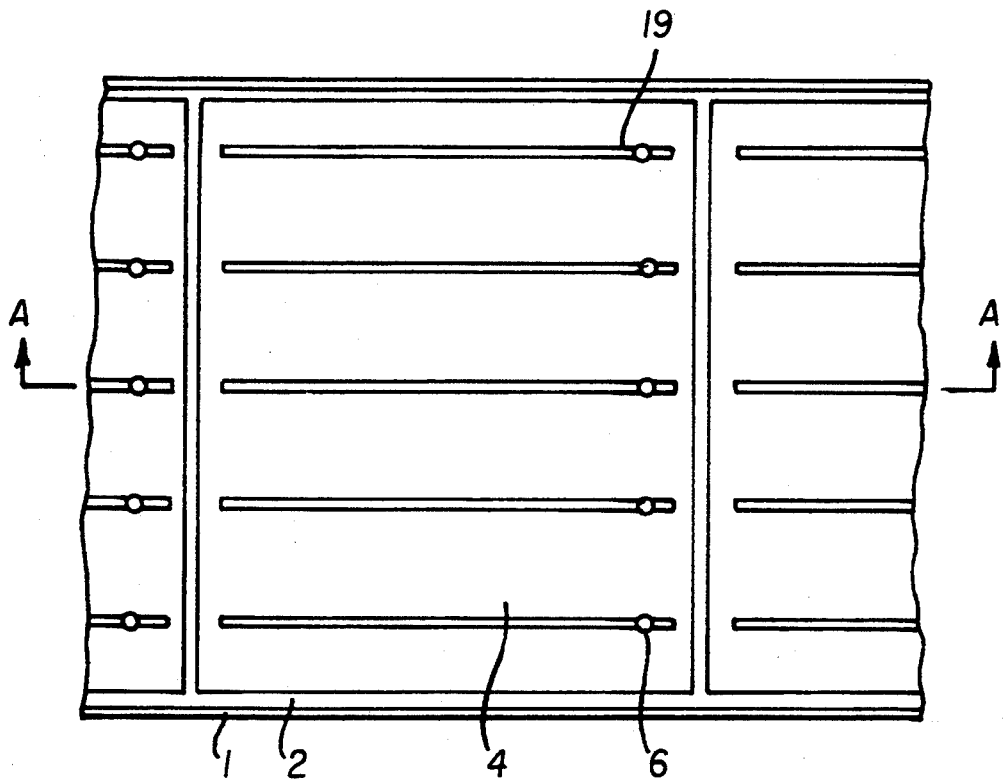
FIGS. 28(a) and (b) show a solar cell with a series-connection structure according to another embodiment of the present invention, in plan view, and in a cross-sectional view along the A—A line.
Figure 28B:
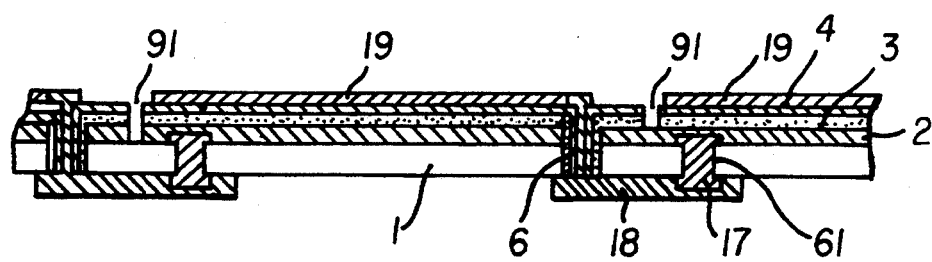

FIG. 28 shows an embodiment that has reduced the number of the through holes 6, wherein collector electrodes 19 are printed on top of the transparent electrode layer 4, their ends contacting the printing electrodes 18 set in the through holes 6.

Figure 29A:
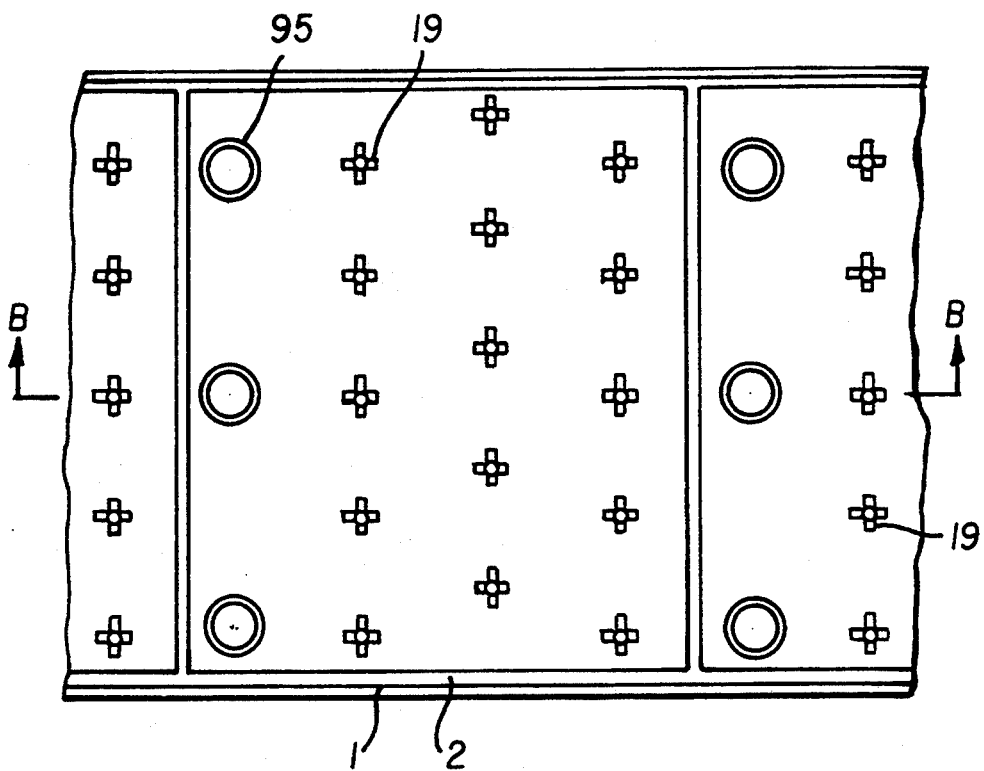
FIGS. 29(a) and (b) show a solar cell with a series-connection structure, according to another embodiment of the present invention, in plan view, and in a cross-sectional view along the B—B line.
Figure 29B:
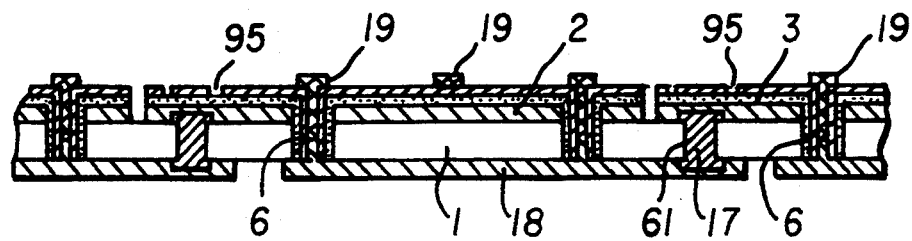
Figure 30A:
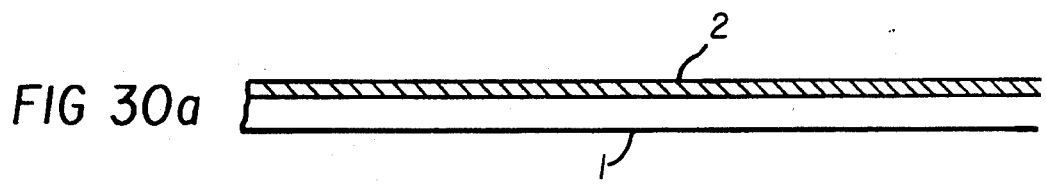
FIGS. 30(a) to (e) show cross-sectional views of the manufacturing processes of thin-film solar cells with series-connection structures according to another embodiment of the present invention.
Figure 30B:
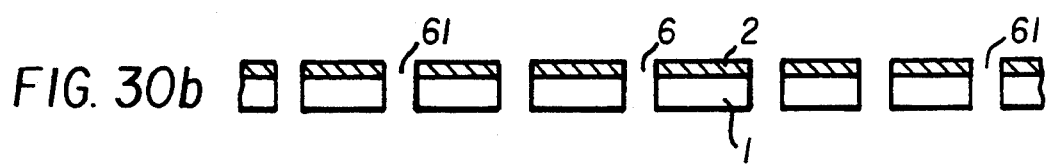
Figure 30C:
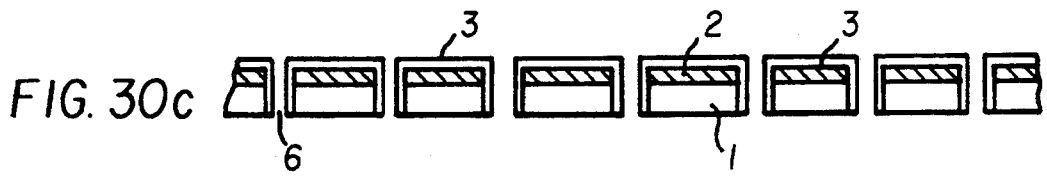
Figure 30D:
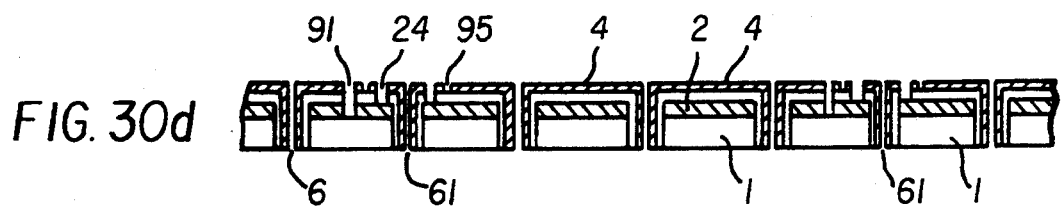
Figure 30E:
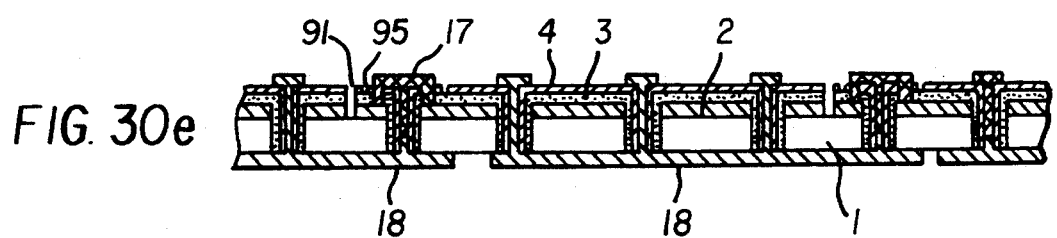
Figure 31A:
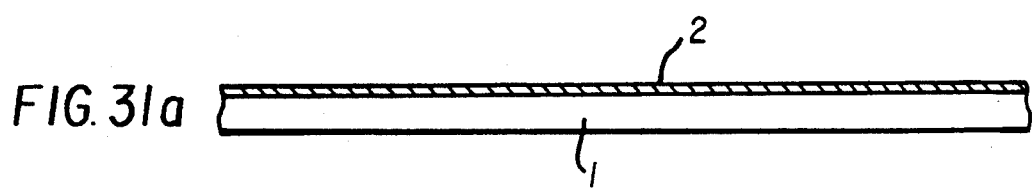
FIGS. 31(a) to (e) show cross-sectional views of the manufacturing processes of thin-film solar cells with series-connection structures according to another embodiment of the present invention.
Figure 31B:
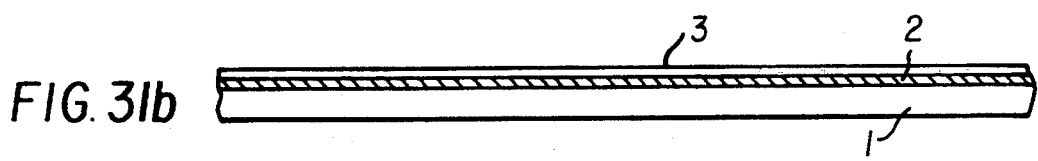
Figure 31C:
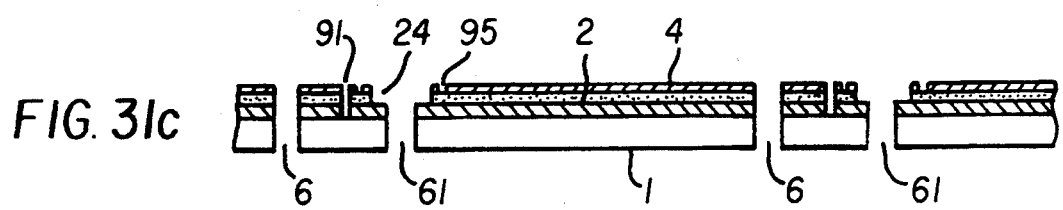
Figure 31D:
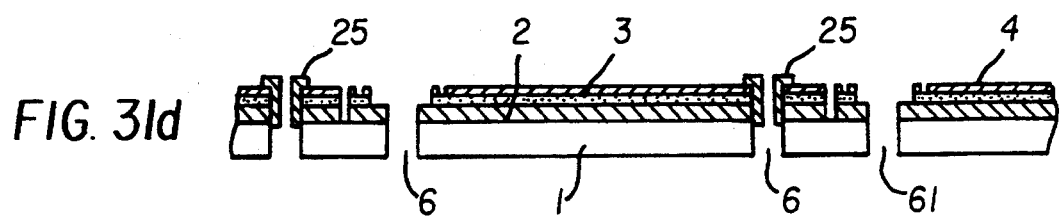
Figure 31E:
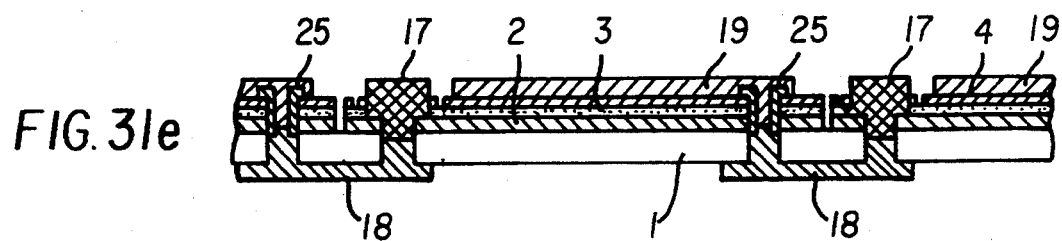

In the embodiment shown in FIG. 29, the circumferential portions 95 on top of the through holes 61 are removed by a laser beam process when pinholes may be generated on the semiconductor layer 3 because the surface shape of the printed electrode 17 is too coarse, which causes a short circuit between the transparent electrode layer 4 and the first electrode layer 2. Because the collector electrodes 19 disposed on the through holes 6 in this embodiment take a radial form but are short, the number of through holes 6 is increased.

FIGS. 30(a) through (e) show a manufacturing process for a solar cell of another embodiment of the present invention. In this process, the first electrode layer 2 is formed on the substrate 1 [FIG. 30(a)], after which the through holes 6 and 61 are formed [FIG. 30(b)]. After the semiconductor layer 3 [FIG. 3(c)] is formed thereon and the transparent electrode 4 is formed thereafter, the layers are removed to form connecting holes 24 to be connected with the first electrode layer 2 around the through holes 61 and to form removed portions 91. Moreover, the transparent electrode layer 4 is also removed to form removed portions 95 which prevents short circuits between the transparent electrode layer 4 and the first electrode layer 2. Then, the printing electrodes 17 that fill up the connecting holes 24, and the other printing electrode 18 are formed to complete the series connection. One outstanding feature of this method is that the manufacturing process is simplified because all the printing processes can be concentrated in the final process.

FIGS. 31(a) through (e) show a manufacturing process for a solar cell of yet another embodiment of the present invention. In this process, after the first electrode layer 2 [FIG. 31(a)], the semiconductor layer 3 [FIG. 31(b)], and the transparent electrode layer 4 are formed on the substrate 1, the through holes 6 and 61 are formed. Thereafter, the transparent electrode layer 4 and the semiconductor layer 3 are removed to form the connecting holes 24, and the transparent electrode layer 4, the semiconductor layer 3 and the first electrode layer 2 are removed to form the removed portions 91 and the transparent electrode layer 4 is removed to form the removed portion 95 [FIG. 31(c)]. Next, an insulation layer 25 that prevents short circuits in the first electrode layer 2 is formed on top of the through holes 6 via a printing process [FIG. 31(d)]. Then, the printing electrode 18 to be connected with the transparent electrode layer 4 and the first electrode layer 1, and the printing electrode 17 to be connected with the first electrode layer are also formed via a printing process [FIG. 31(e)]. Since this embodiment allows holes to be formed, layers to be removed, and the printing that uses paste to be performed after each layer has been laminated, films with fewer defects can be formed.

Figure 32:
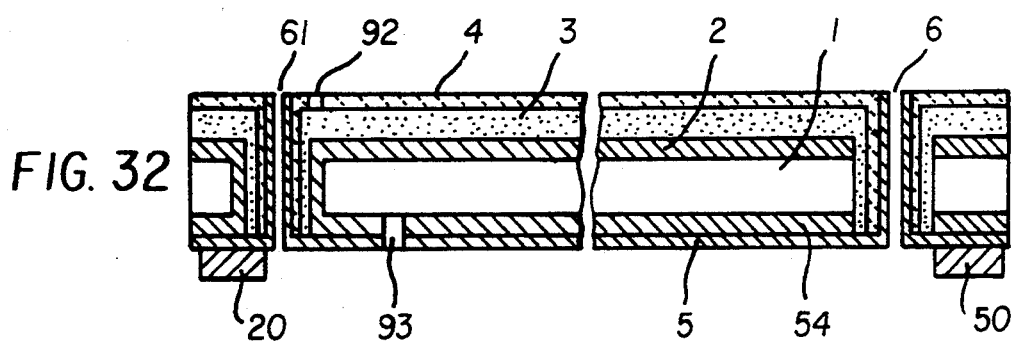
FIG. 32 is a cross-sectional drawing showing a thin-film solar cell according to an embodiment of the present invention.
Figure 33:
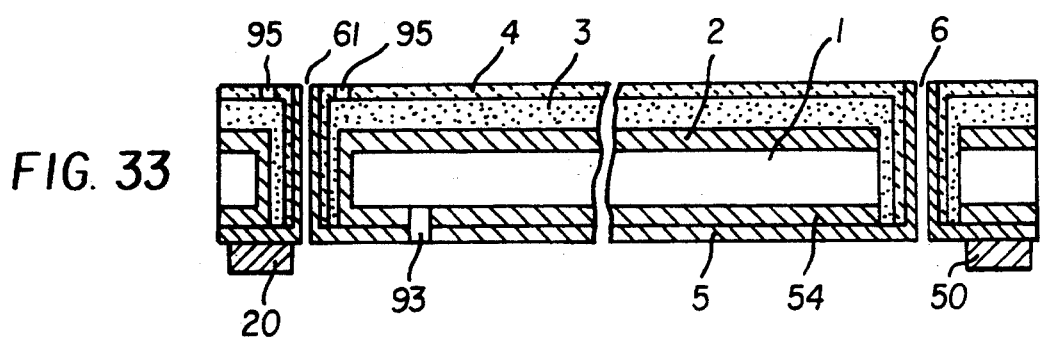
FIG. 33 is a cross-sectional drawing showing a thin-film solar cell according to an embodiment of the present invention.

In conventional thin-film solar cells, in which each layer is laminated on a substrate, output terminals are disposed on the uppermost layer, and lead wires are then connected to draw out the output. Therefore, if the uppermost layer is a transparent electrode layer from which light is admitted, the area occupied by the terminals reduces the photoelectric conversion area. In addition, in order to prevent adverse effects on the semiconductor layer that performs photoelectric conversion, it is necessary to keep connections away from the photoelectric conversion layer. Unlike in the thin-film solar cell according to the present invention, the output can be drawn out from the third electrode layer disposed on the opposite side of the light incidence side, which eliminates the above deficiencies. FIGS. 32 and 33 show an embodiment, in which the first electrode layer 2 is formed on the insulating substrate 1 in a similar manner as in the embodiment shown in FIG. 21 and the fourth electrode layer 54 is formed beneath the substrate. Other constructions are the same as those for the solar cell that has a series-connection structure as shown in FIG. 10, although a (−) output terminal 50 is disposed on the region of the third electrode layer 5 connected to the second electrode layer 4, and a (+) output terminal 20 is disposed on the region of the third electrode layer 5 connected to the first electrode layer 2 via the fourth electrode layer 54, both opposite the light incidence side of the substrate 1. Since in this construction the output terminals 20 and 50 can be positioned beneath the photoelectric conversion layer 3, as shown in the figure, the incidence of light is not interrupted, which serves to increase the effective power generation area and makes it possible to position the output terminals 20 and 50 freely. That is, for example, raising the rate of the good product in mass production. Furthermore, since the construction allows the terminals to be connected with lead wires on the opposite side of the semiconductor layer 3 which is weak to dust and heat, via the substrate 1, adverse effects on the solar cell arising from the connection can be reduced.

The construction in FIG. 32 differs from that in FIG. 33 in the following points. In FIG. 32, the region in the third electrode layer 5, which is connected to the first electrode layer 2, is separated from the transparent electrode layer 4 by the linearly removed portion 92. Unlike in FIG. 33, separation is made possible by the annularly removed portion 95 around the through hole 61. This construction further increases the effective power generation area. It goes without saying that these embodiments, in which the fourth electrode layer 54 is disposed beneath the substrate 1, can be applied to a construction consisting only of the third electrode layer 5.

Figures 34A, 34B, 34C:
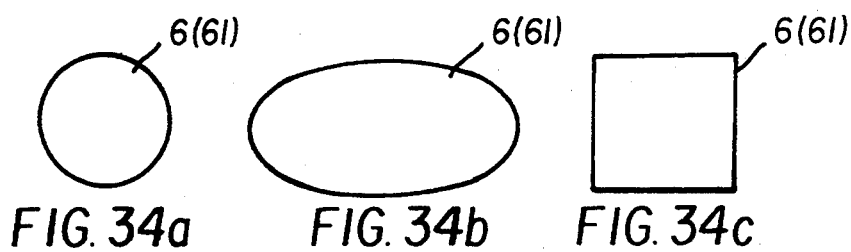
FIGS. 34(a) to (f) show plan views of connecting holes of various shapes.
Figures 34D, 34E:
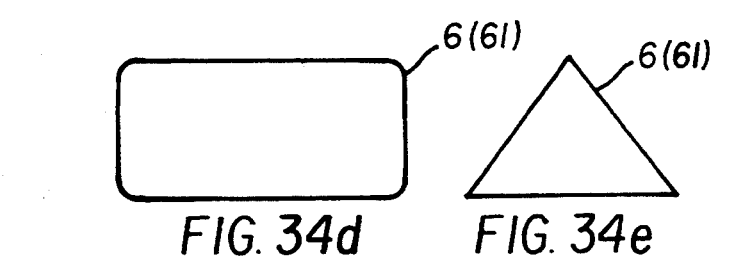
Figure 34F:
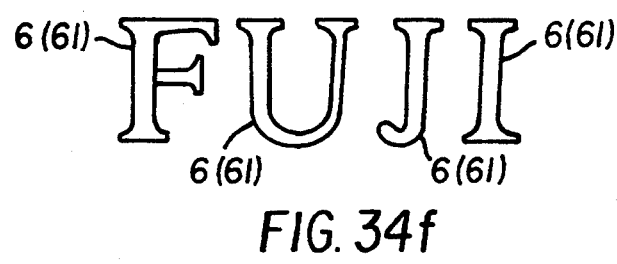

If a polymer film is used for the substrate 1, the materials used may include polyethylene naphthalate, polyamide, etc. Moreover, the first electrode layer 2 may use multi-layered films made of silver/transparent conductive materials in addition to aluminum and silver. The film need not be formed via a sputtering process, since a deposition process may also be used. The transparent electrode layer 4 generally uses conductive oxide materials such as ITO and $SnO_2$ in addition to ZnO. For the third electrode layer 5, silver and chromium may be used in addition to titanium, stainless steel, and aluminum. The connecting hole 6 or 61 may be formed by a process that uses lasers. The connecting holes 6 and 61 need not necessarily be circular, but should preferably be a shape requiring as small an area as possible and with as long a circumferential length as possible in order to improve the area efficiency. Otherwise, the various shapes shown in FIG. 34 are also possible depending on the design and construction of the hole-forming jigs. The thin-film semiconductor layer 3 may utilize such junctions as CdTe/CdS and $CuInSe_2$/CdS, other than a PIN junction which uses an amorphous semiconductor made of a material such as hydrogenated amorphous silicon (a-Si:H), which is deposited by a plasma CVD process.

According to the present invention, the path along which an electric current flows through a transparent electrode layer with a high sheet resistance can be shortened by forming holes on the insulating substrate on the side opposite the light incidence side of the thin-film solar cell, and connecting a transparent second electrode layer with a third electrode layer on the rear side of the substrate that has these holes. Such a construction makes it possible to provide a thin-film solar cell that can be constructed with a low voltage and large current without being split into solar cells of a limited size, and which will exhibit reduced joule loss and an increased effective power generation area as a result of the reduction of dead space. Therefore, the invention is very effective for constructing a thin-film solar cell with a low voltage and a large current. Furthermore, a series-connection structure can easily be formed without applying a precise patterning technique, by forming exposed first electrode regions over parts of the solar cells, and connecting a separated third electrode layer, which is connected to conductors that pierce the regions and the substrate, to the third electrode layers of the adjoining solar cells.

Connections via the connecting holes and through the substrate can be easily made by utilizing low-melting point alloys such as solder, and printing conductors, instead of utilizing extended portions of the electrode layers on both sides of the substrate. This greatly increases the positive effects of the present invention.

What is claimed is:

1. A thin-film solar cell comprising:
a first electrode layer disposed on a face of an insulating substrate, a transparent second electrode layer disposed opposite the first electrode layer so as to sandwich a semiconductor layer therebetween, the semiconductor layer being a photoelectric conversion layer, a third electrode layer disposed on the opposite face of the substrate, the third electrode layer being electrically connected to the second electrode layer by a first conductor which is substantially insulated from the first electrode layer, the first conductor extending through a first connecting hole that extends through the substrate, the first electrode layer and the semiconductor layer.

2. The cell of claim 1, further comprising a plurality of first connecting holes which are equidistantly spaced apart from each other.

3. The cell of claim 1, wherein a region in the third electrode layer which is separated from a region connected to the second electrode layer is connected to the first electrode layer by a second conductor, said second conductor being substantially insulated from a sandwiching region of the second electrode layer which sandwiches the semiconductor layer with the first electrode layer, said second conductor extending through a second connecting hole which extends through the insulating substrate.

4. The cell of claim 3, wherein an extended portion of the second conductor contacts the second electrode layer at a contacting region thereof, said contacting region of a second electrode layer being separated by a linearly removed portion from said sandwiching region.

5. The cell structure of claim 3, wherein at least one of the first and second conductors is portion of the third electrode layer which extends into its respective first or second connecting hole.

6. The cell structure of claim 3, wherein the second conductor is a portion of the first electrode layer extending into the second connecting hole.

7. The cell structure of claim 3, wherein the second conductor extends through the substrate, the first electrode layer, the semiconductor layer, and the second electrode layer.

8. The cell structure of claim 3, wherein the first and second conductors are comprised of low-melting point alloys filled in their respective first and second connecting holes.

9. The cell structure of claim 3, further comprising terminals disposed on the third electrode layer on the side opposite the substrate.

10. The cell structure of claim 1, wherein the semiconductor layer is made of amorphous semiconductor thin-film.

11. The cell structure of claim 1, wherein the first or the third electrode layer is made of a metallic thin-film.

12. The cell structure of claim 1, wherein the first conductor is a portion of the second electrode layer that extends into the first connecting hole.

13. The cell structure of claim 1, wherein the first conductor is a portion of the third electrode layer which extends into the first connecting hole.

14. The cell structure of claim 1, wherein the first conductor is a portion of a current collector electrode layer on the second electrode layer formed by printing which extends into the first connecting hole.

15. The cell structure of claim 1, wherein the first conductor is comprised of a low-melting point alloy filled into the first connecting hole.

16. The cell structure of claim 1, wherein the first conductor is insulated from the first electrode by an extended portion of the semiconductor layer which is interposed between the first conductor and the first electrode layer.

17. A thin-film solar cell structure comprising: several solar cells formed on a common insulating substrate, each solar cell comprising a first electrode layer disposed on a face of the insulating substrate, a transparent second electrode layer disposed opposite the first electrode layer so as to sandwich a semiconductor layer therebetween, the semiconductor layer being a photoelectric conversion layer, a third electrode layer disposed on the opposite face of the substrate, the third electrode layer being electrically connected to the second electrode layer by a first conductor which is substantially insulated from the first electrode layer, the first conductor extending through a first connecting hole that extends through the substrate, the first electrode layer and the semiconductor layer, the solar cells being connected in series by an extended portion of the first electrode layer in one solar cell which is connected to an extended portion of a third electrode layer in an adjoining solar cell by a second conductor substantially insulated from the second electrode layer in said one solar cell, said second conductor extending through a second hole extending through the substrate.

18. The cell structure of claim 17, wherein the solar cells are arranged adjoining each other in an arrangement direction, and the extended portions of the third electrode layer in the solar cells and the third electrode in the adjoining solar cells are adjoined perpendicularly to each other with respect to said arrangement direction.

19. The cell of claim 17, wherein the solar cells are arranged adjoining each other in an arrangement direction, and the extended portions of the third electrode layer in the solar cells and the third electrode in adjoining solar cells adjoin each other along said arrangement direction.

20. The cell structure of claim 19, wherein the width of the third electrode layer including the extended portion in the arrangement of the solar cells is substantially the same as the width of the laminated body comprising the first electrode layer, the semiconductor layer and the second electrode layer.

21. The cell structure of claim 19, wherein the solar cells are arranged in several banks, the solar cells in two banks are connected in series by the third electrode layer which is arranged in common with terminals on both banks to the first electrode layer in the end solar cell in one of the banks and the second electrode layer in the end solar cell of the other bank through connecting holes extending through the respective substrate.

22. The cell structure of claim 17, wherein an area in the vicinity of the second electrode layer connected to the extended portion of the third electrode layer is exposed.

23. The cell structure of claim 17, wherein an area in the vicinity of the second electrode layer connected to the extended portion of the third electrode layer is covered with the semiconductor layer.

24. The cell structure of claim 17, further comprising terminals disposed on the third electrode layer on the side opposite the substrate.

25. The cell structure of claim 17, wherein the semiconductor layer is made of amorphous semiconductor thin-film.

26. The cell structure of claim 17, wherein the first or the third electrode layer is made of a metallic thin-film.

27. The cell structure of claim 17, wherein the first conductor is a portion of the second electrode layer that extends into the first connecting hole.

28. The cell structure of claim 17, wherein at least one of the first and second conductors is a portion of the third electrode layer which extends into its respective first or second connecting hole.

29. The cell structure of claim 17, wherein the first conductor is a portion of a current collector electrode layer on the second electrode layer formed by printing which extends into the first connecting hole.

30. The cell structure of claim 17, wherein the second conductor is a portion of the first electrode layer extending into the second connecting hole.

31. The cell structure of claim 17, wherein the second conductor extends through the substrate, the first electrode layer, the semiconductor layer, and the second electrode layer.

32. The cell structure of claim 17, wherein the first and second conductors are comprised of low-melting point alloys filled in their respective first and second connecting holes.

33. The cell structure of claim 17, wherein the first conductor is insulated from the first electrode by an extended portion of the semiconductor layer which is interposed between the first conductor and the first electrode layer.

34. A method for manufacturing a thin-film solar cell, comprising the steps of:
 depositing a first electrode layer on a face of an insulating substrate having a first connecting hole preformed therethrough;
 removing a portion of the first electrode layer along the inner wall of the first connecting hole and an outer peripheral portion of the first electrode layer surrounding the first connecting hole via a laser beam;
 laminating a semiconductor layer and a second electrode layer on said first electrode layer; and
 laminating a third electrode layer on the opposite side of the insulating substrate.

35. A method for manufacturing a thin-film solar cell, comprising the steps of:
 depositing a first electrode layer on a face of an insulating substrate;
 forming a first connecting hole after the first electrode layer has been deposited on the face of the insulating substrate;
 sequentially laminating a semiconductor layer and a second electrode layer on the first electrode layer, and
 forming a third electrode layer on the opposite face of the insulating substrate.

36. The method of claim 35, wherein the second and third electrode layers are connected to each other by braising through the first connecting hole.

37. The method of claim 35, further comprising the step of removing portions of at least one of the first, second, and third electrode layers by laser processing.

38. The method of claim 37, wherein the portions of the first and third electrode layers which sandwich the substrate are removed simultaneously.

* * * * *